United States Patent [19]

Izumiya et al.

[11] Patent Number: 5,005,057
[45] Date of Patent: Apr. 2, 1991

[54] SEMICONDUCTOR LIGHT-EMITTING DIODE AND METHOD OF MANUFACTURING THE SAME

[75] Inventors: Toshihide Izumiya, Tokyo; Yasuo Ohba, Yokohama; Ako Hatano, Tokyo, all of Japan

[73] Assignee: Kabushiki Kaisha Toshiba, Kawasaki, Japan

[21] Appl. No.: 508,685

[22] Filed: Apr. 13, 1990

[30] Foreign Application Priority Data

Apr. 28, 1989 [JP] Japan .................................. 1-110503

[51] Int. Cl.$^5$ .................... H01L 33/00; H01L 27/12; H01L 49/02; H01L 45/00
[52] U.S. Cl. .............................. 357/17; 357/4; 357/16; 357/30; 357/61
[58] Field of Search .................... 357/17, 61, 4, 16, 30

[56] References Cited

U.S. PATENT DOCUMENTS

| | | | |
|---|---|---|---|
| 4,213,781 | 7/1980 | Noreika et al. | 357/61 |
| 4,841,531 | 6/1989 | Kondow et al. | 357/17 |
| 4,916,496 | 4/1990 | Tomomura et al. | 357/17 |
| 4,918,497 | 4/1990 | Edmond | 357/17 |

OTHER PUBLICATIONS

Semiconductor Lasers and Heterojunction LED's, 1977, Academic Press, Inc., H. Kressel and J. K. Butler, pp. 486, 487.
Appl. Phys. Left. vol. 43, pp. 1034–1036, Dec. 1983, H. Ishigro, et al, "High efficient GaAlAs light-emitting diodes of 660 nm with a double heterostructure on a GaAlAs substrate".
Electronics Letters, vol. 23, pp. 134–136, 1987, K. Iga, et al "Microcavity GaAlAs/GaAs Surface-Emitting Laser with $I_{th}=6$ mA".

*Primary Examiner*—Andrew J. James
*Assistant Examiner*—Daniel Kim
*Attorney, Agent, or Firm*—Oblon, Spivak, McClelland, Maier & Neustadt

[57] ABSTRACT

A blue LED which includes a light-emitting layer having a p-n junction makes use of the superlattice structure being formed of a plurality of BP layers and $Ga_xAl_{1-x}N$ ($0 \leq x \leq 1$) layers which are alternately stacked, with the $Ga_xAl_{1-x}N$ ($0 \leq x \leq 1$) layers having a zinc blende type structure, or else makes use of a $Ga_xAl_yB_{1-x-y}N_zP_{1-z}$ ($0 \leq x, y, z \leq 1$ and $x+y \leq 1$) mixed crystal layer having a zinc blende type crystal structure.

13 Claims, 19 Drawing Sheets

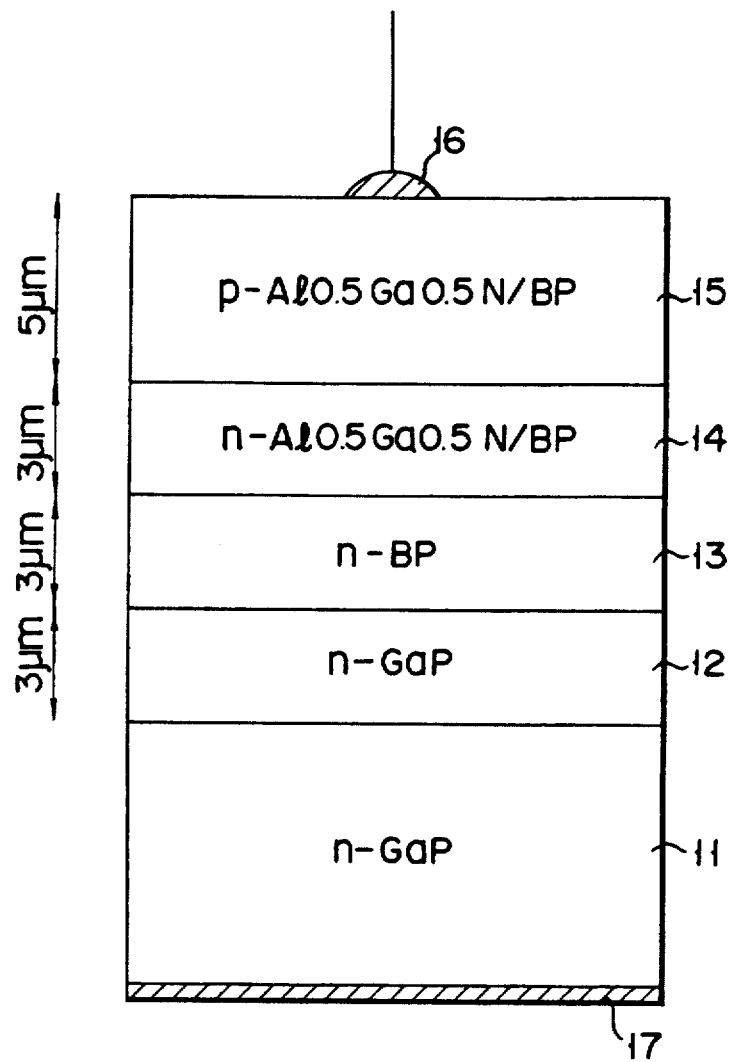
F I G. 1

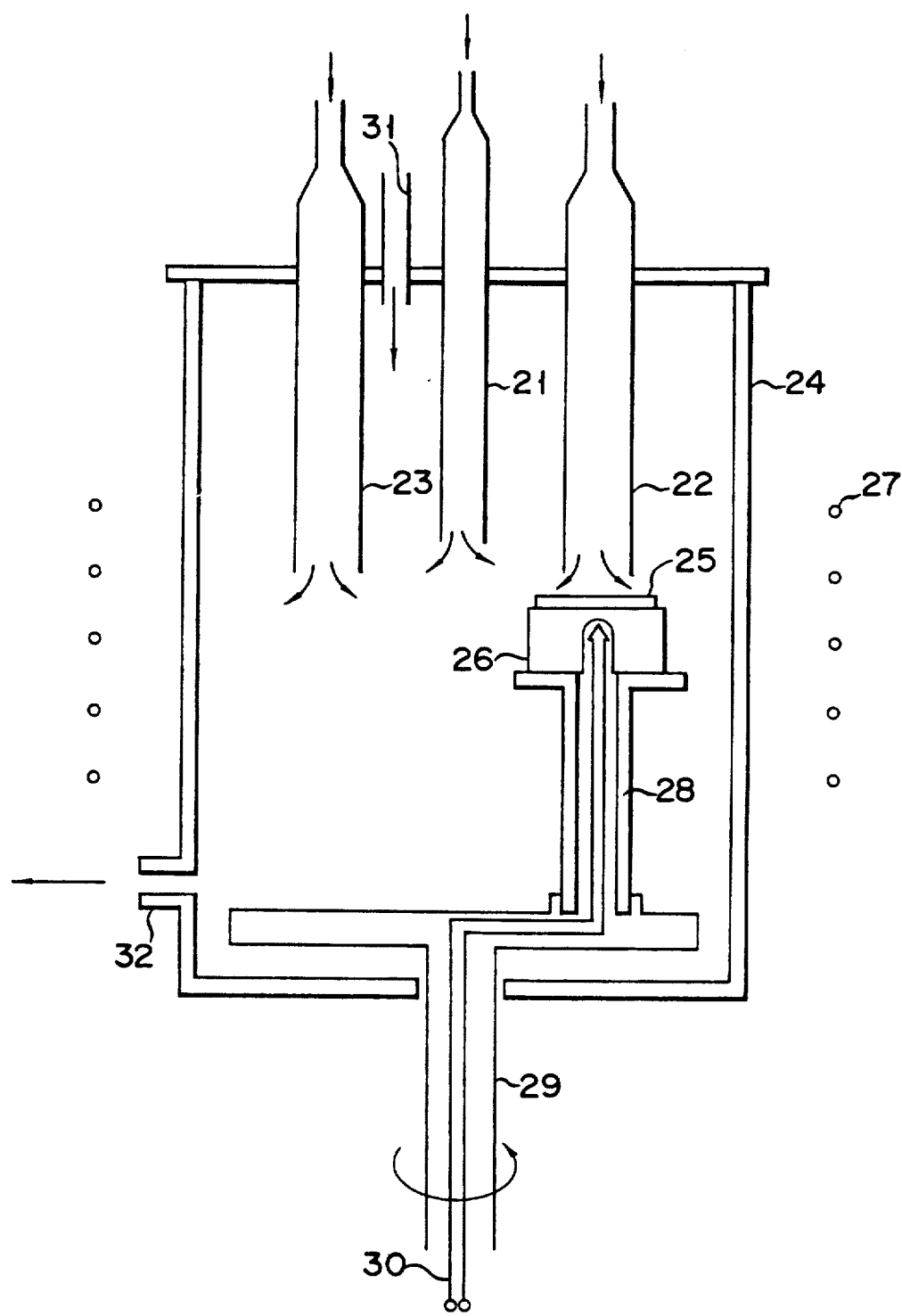
F I G. 2

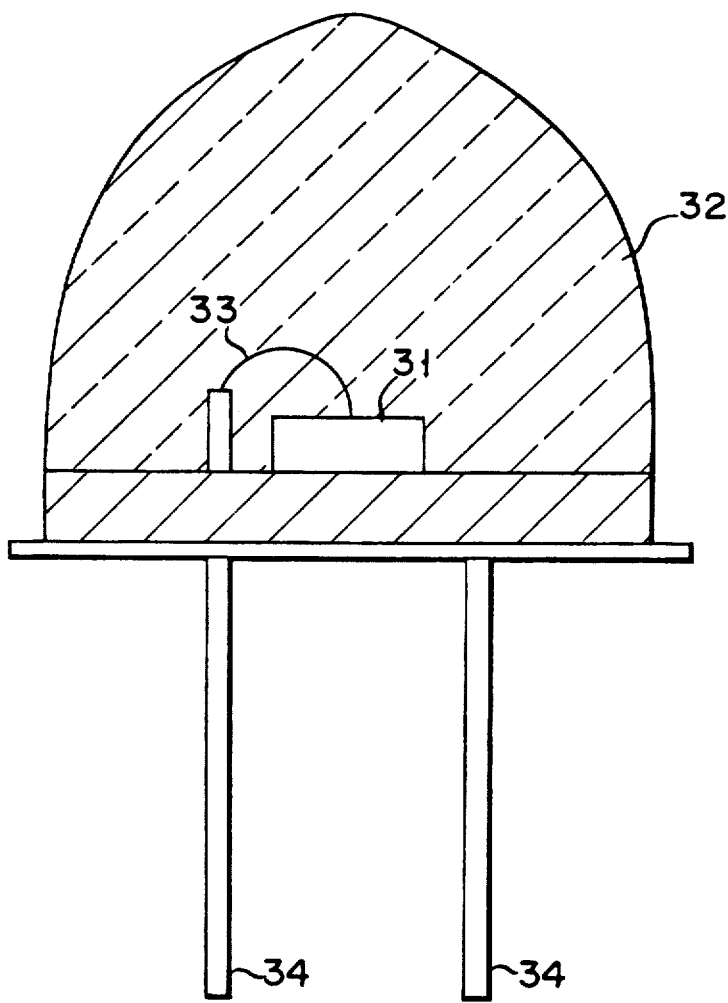
F I G. 3

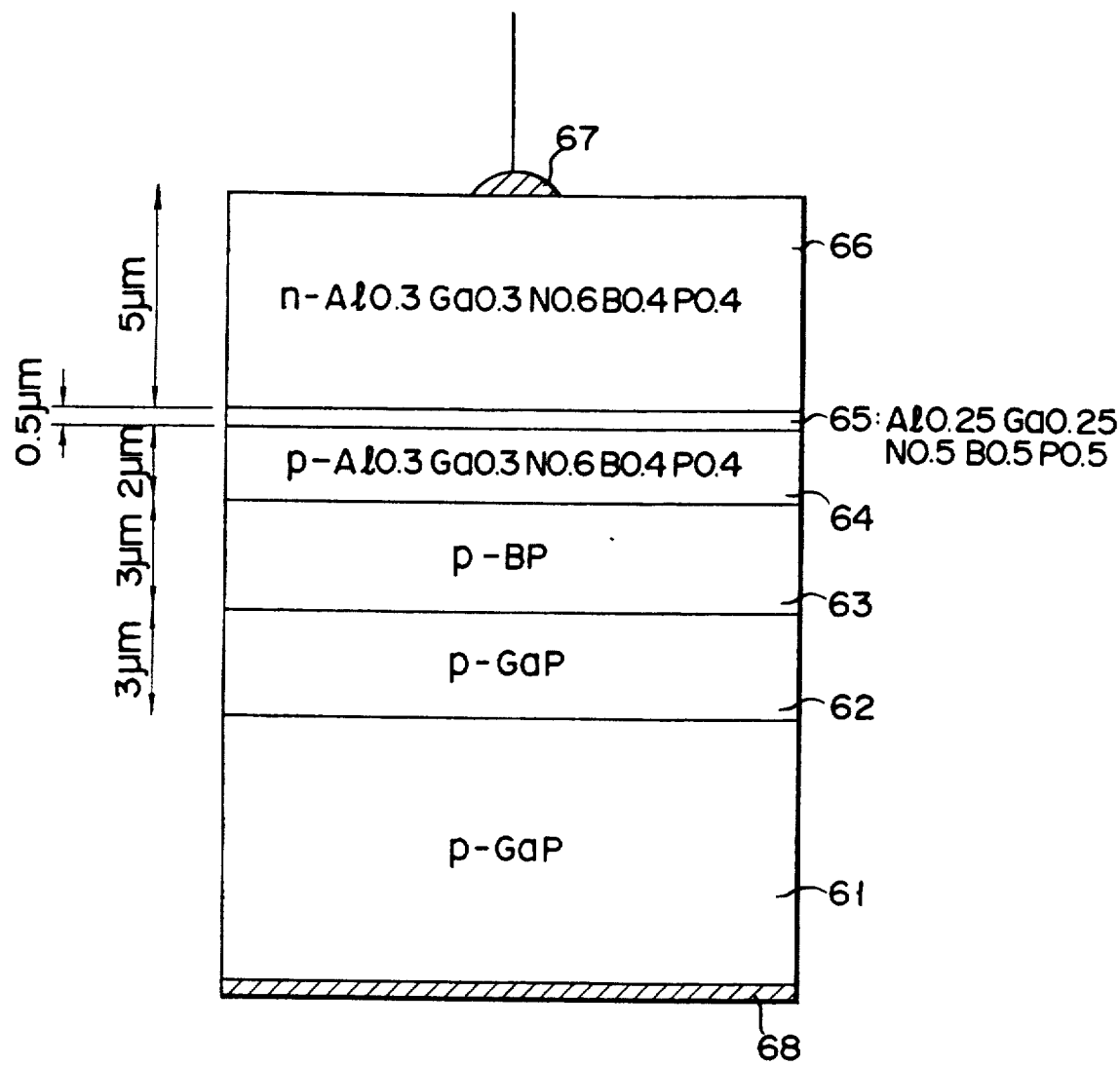
F I G. 6

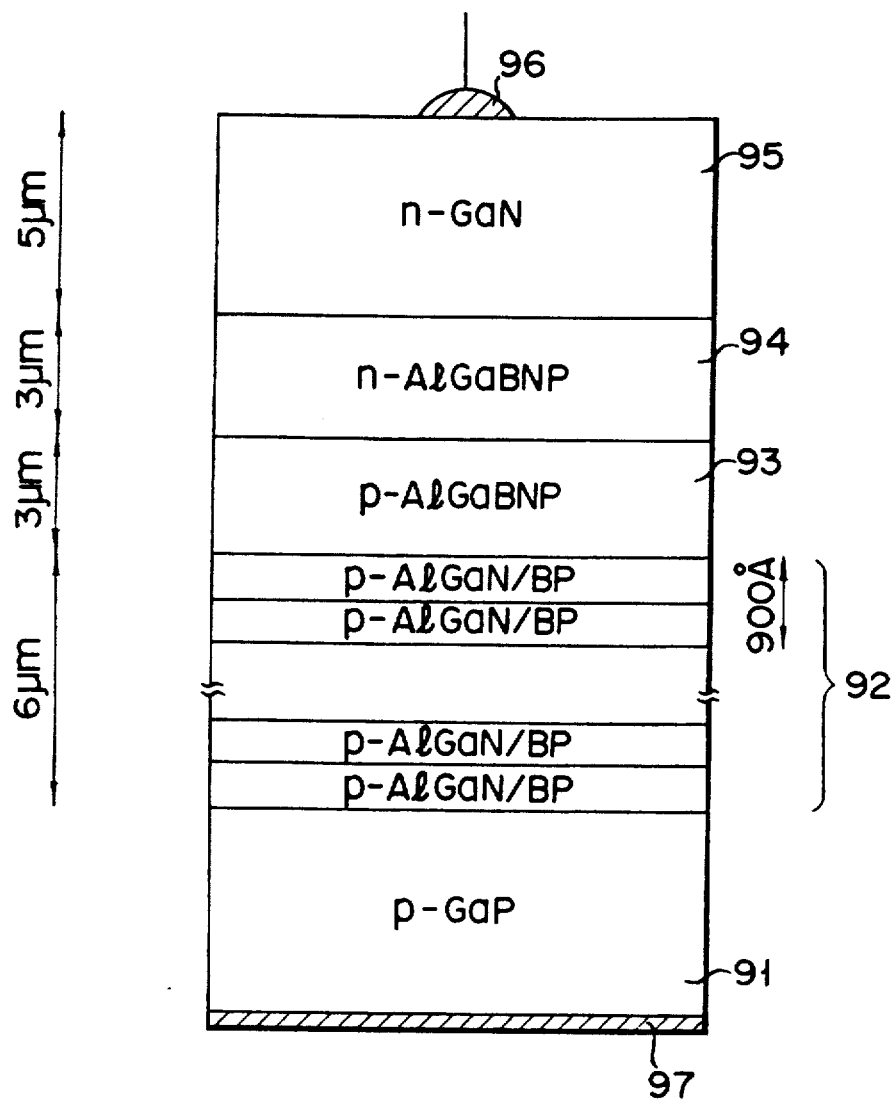
F I G. 9

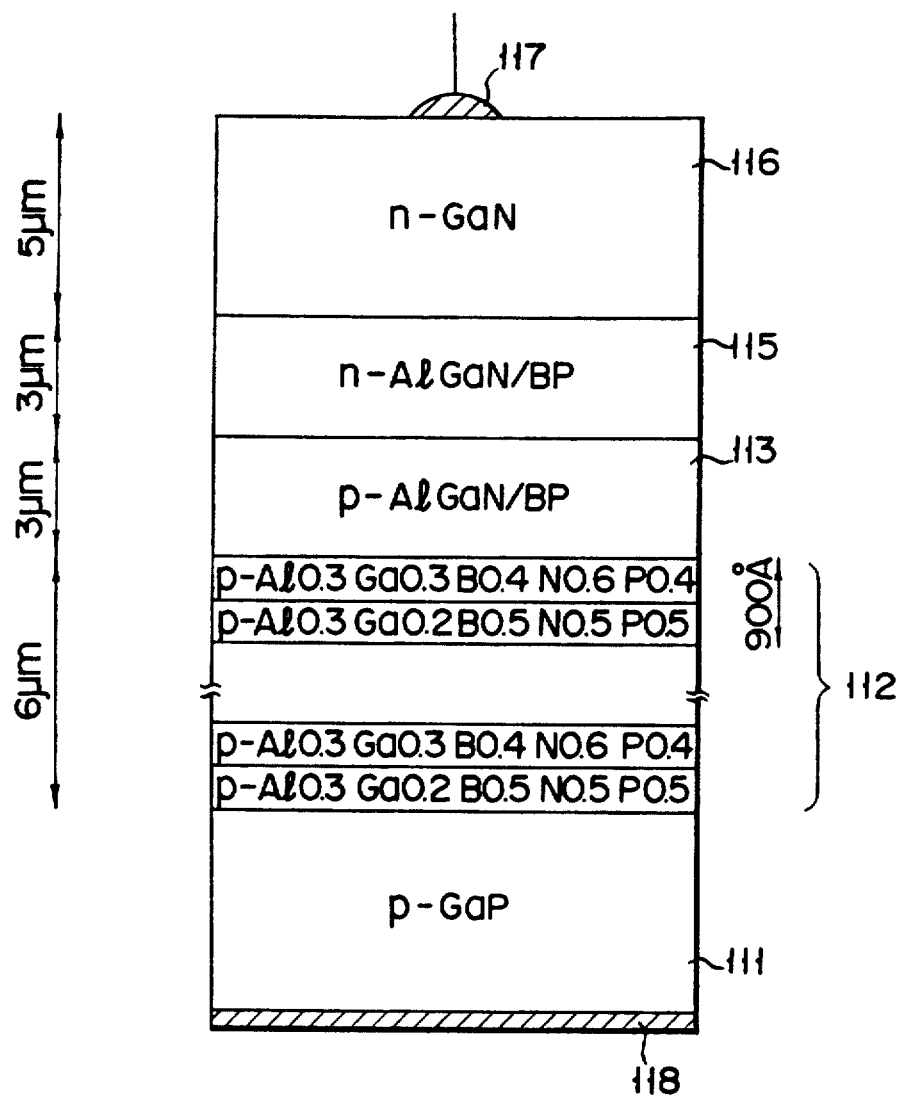
F I G. 12

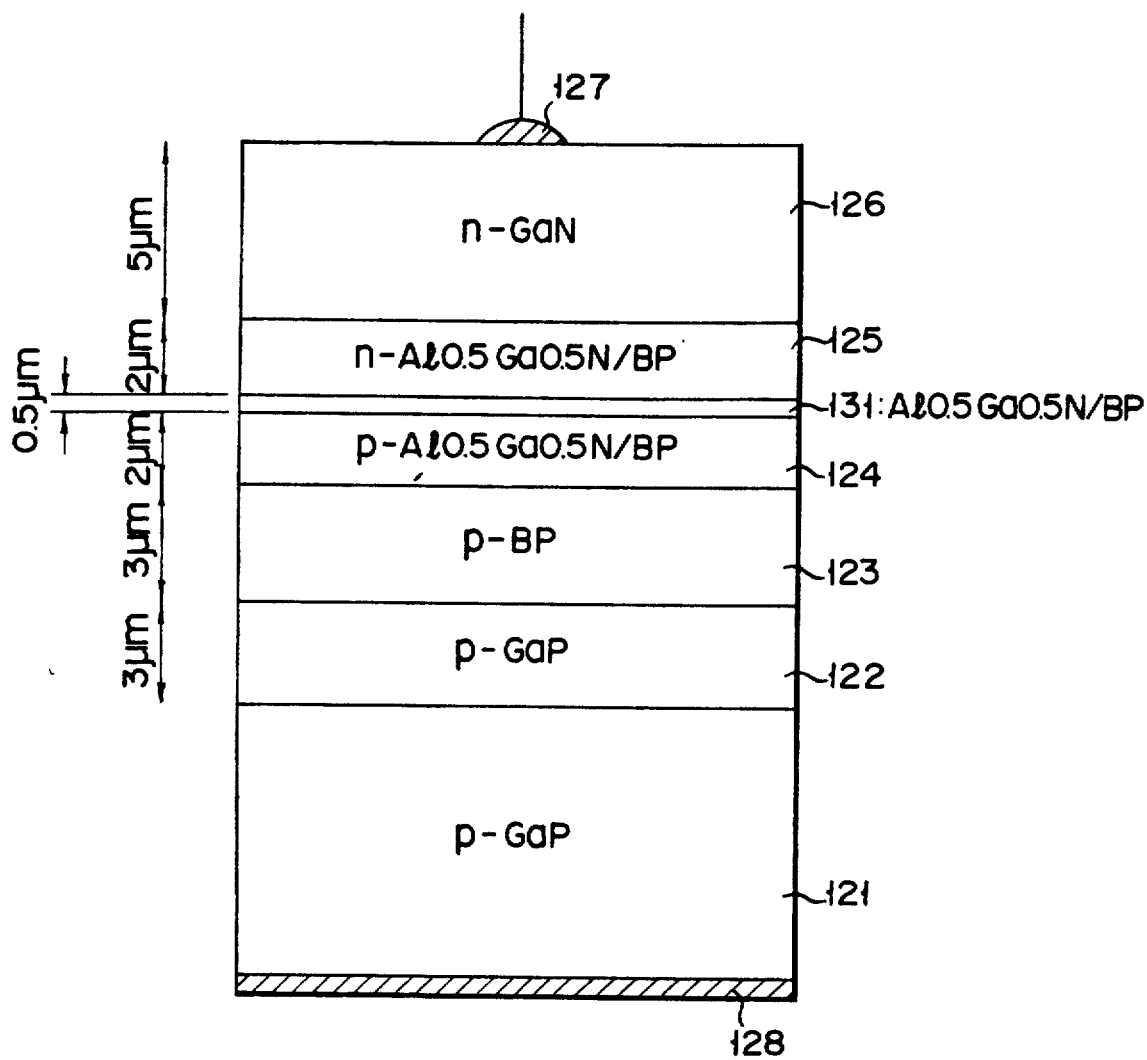
F I G. 14

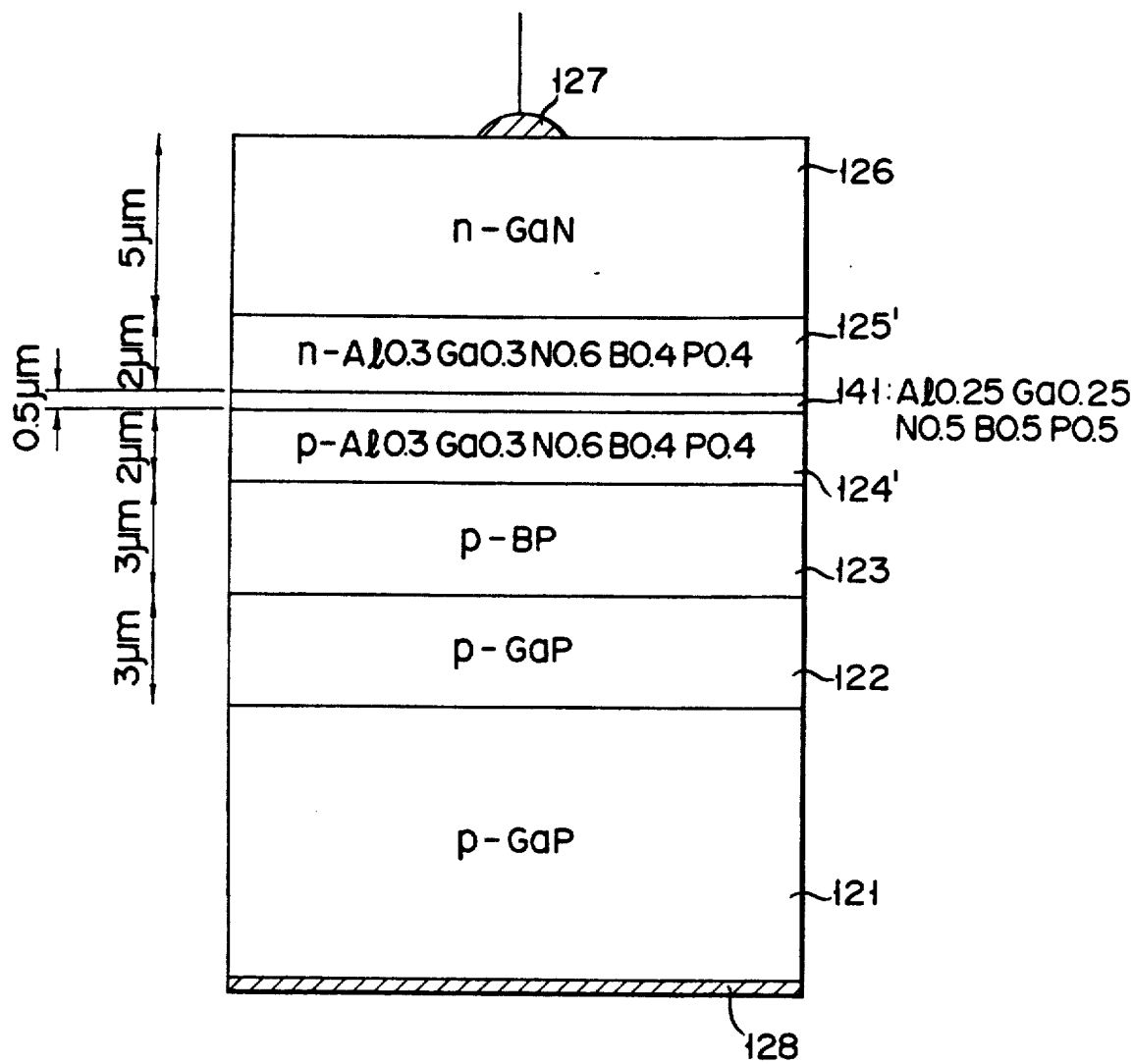
F I G. 16

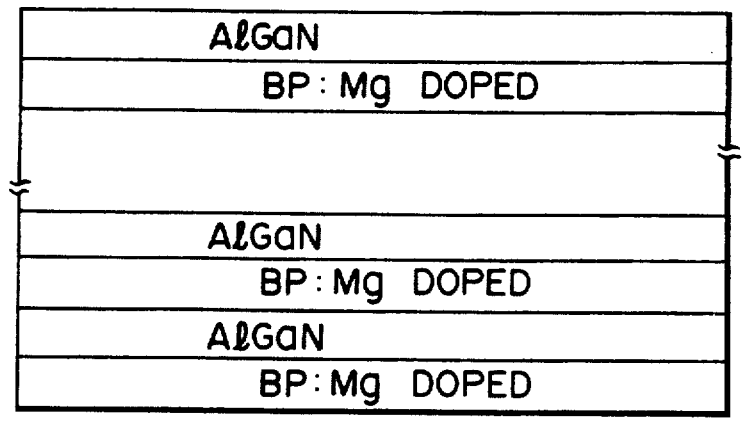
F I G. 17A
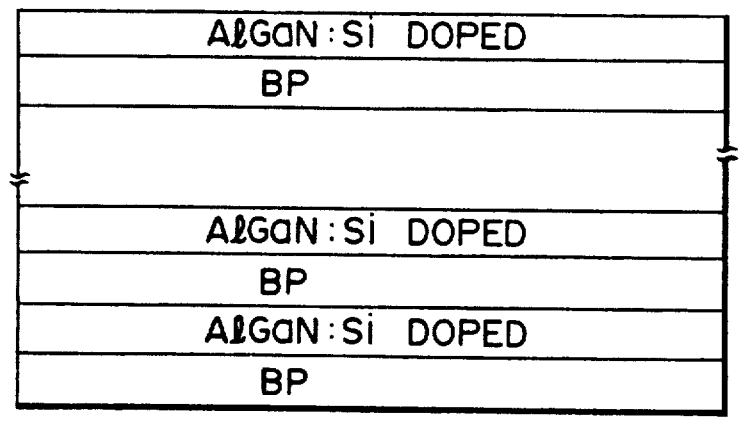
F I G. 17B

SEMICONDUCTOR LIGHT-EMITTING DIODE AND METHOD OF MANUFACTURING THE SAME

BACKGROUND OF THE INVENTION

1. Field of the Invention

The present invention relates to a semiconductor light-emitting diode (LED) with a short wavelength, which uses a compound semiconductor material having a wide band gap, and a method of manufacturing the same.

2. Description of the Related Art

As a consequence of the development of high-speed, high-density data processing systems, demand has arisen for the realization of an LED having a short wavelength; in particular, a blue high-luminance LED.

Group III-V compound semiconductor materials, from which a blue LED is expected, and having a wide band gap, include nitrides and phosphides of relatively light III group elements, such as BN (4 or 8 eV), AlN (6 eV), GaN (3.4 eV), InP (2.4 eV), AlP (2.5 eV), and GaP (2.3 and 2.8 eV). However, it is difficult to synthesize the high pressure phase (c-BN) having sp3 bonding. In addition, BN has three types of polymorphism and tends to form a mixture. Furthermore, it is difficult to perform impurity doping in the case of BN. For the above reasons, therefore, BN is not suitable. InN has an insufficiently wide band gap for the realization of a blue LED and poor thermal stability, and only a polycrystal can normally be obtained. AlP and GaP both have insufficiently wide band gaps. The remaining materials, AlN and GaN, both have wide band gaps and excellent stability, and are therefore are suitable for short-wavelength light emission. However, AlN and GaN have a Wurzite type crystal structure (to be referred to as a WZ type hereinafter). In addition, since they have a high ionizing property, lattice defects easily occur, and a p-type semiconductor with low resistivity cannot be obtained.

Accordingly, attempts have been made to mix B and N with a III-V group-based compound which has been developed as a material for a conventional semiconductor laser, to obtain a material having a wide band gap and which does not have the above drawbacks. However, the lattice constant of the conventional material differs from that of the material containing B and N by as much as 20 to 40%, and both materials also have different crystal structures. Consequently, a stable crystal cannot be obtained. For example, when N is mixed with GaP, the ratio of N to GaP was 1% or less. Thus, a sufficiently wide band gap material cannot be obtained.

According to studies carried out by the present inventors, a p-type crystal having a low resistance cannot be obtained using GaN or AlN, due to their high ionizing properties, defects can easily occur. However, the essential reason for their non-usability is that GaN and AlN do not have a zinc blend type crystal structure (to be referred to as a ZB type hereinafter), but rather a WZ structure.

As described above, no conventional semiconductor material can fully satisfy the conditions that the band gap required to realize a high-luminance blue LED is as large as, for example, 2.7 eV or more, and that p- or n-type conductivity can be controlled, and excellent crystal quality can be achieved. Although a nitride such as AlN or GaN is a suitable material for obtaining a large band gap, a p-type layer with low resistivity cannot be obtained using such a nitride.

SUMMARY OF THE INVENTION

It is therefore an object of the present invention to provide an LED for emitting blue light and which has a p-n junction made from a new compound semiconductor material.

It is another object of the present invention to provide a method of manufacturing the above LED.

An LED according to the present invention is characterized by comprising a super lattice layer make up of a plurality of BP layers and $Ga_xAl_{1-x}N$ ($0 \leq X \leq 1$) layers alternately stacked as p- and n-type semiconductor layers which constitute a light-emitting layer having a p-n junction, the $Ga_xAl_{1-x}N$ ($0 \leq X \leq 1$) layers having a zinc blend type crystal structure.

The LED according to the present invention comprises a $Ga_xAl_yB_{1-x-y}N_zP_{1-z}$ ($0 \leq x, y, z \leq 1$ and $x+y \leq 1$) mixed crystal layer having a zinc blend type crystal structure as a light-emitting layer having a p-n junction.

A method of manufacturing the LED according to the present invention comprises the steps of growing a light-emitting layer including the above-mentioned superlattice layer or mixed crystal layer on a substrate, directly or via a buffer layer, removing the substrate after the light-emitting layer is grown, thereby to obtain an LED chip, and mounting the chip on a header, using as a light output surface one from which the substrate has been removed.

On the basis of studies carried out by the present inventors, it has been found that a crystal normally having a WZ structure retains a ZB structure to a certain thickness if this crystal is grown on a crystal having a stable ZB structure. For this reason, the first LED according to the present invention includes a superlattice layer obtained by alternately stacking a plurality of $Ga_xAl_{1-x}N$ ($0 \leq X \leq 1$) layers and BP layers having substantially equal bond lengths, a ZB structure, a low ionizing property, and which can easily perform p- and n-type conductivity control. Such a superlattice structure permits the attainment of a compound semiconductor material of ZB structure, which has the wide band gap characteristics of a direct transition type of nitride and the low ionizing property of BP, for suppressing the occurrence of defects. In the first LED according to the present invention, a p-n junction is achieved using this superlattice structure. As a result, high-luminance blue light emission is realized.

It has been conventionally held that thermodynamically stable III-V mixed compound semiconductor materials cannot be obtained when combinations of III group elements, i.e., B and Ga, Al or In, or combinations of V group elements i and P or As are included. On the basis of two other studies carried out by the present inventors, it was found that when relatively large amounts of B and N are mixed at the same time, a stable mixed crystal can often by obtained by using the above combinations. Specifically, it was found that a stable crystal could be obtained where the composition of a $Ga_xB_{1-x}N_zP_{1-z}$-based mixed crystal substantially satisfied $x = z$. When this mixed crystal is observed using a transmission electron microscope, the ordering, namely selective bonds of Ga-N and B-P are alternately aligned, can be clearly observed. From such observation, it is apparent that the Ga-N and B-P bonds bring about a reduction in the total energy of the mixed crystal and render it stable. On the basis of the above studies, it should be clear that lattice constants or crystal structures do not always have to be the same in order to obtain a stable mixed crystal: however, it is important that bond lengths be substantially equal. Thus, the second LED according to the present invention employs a compound semiconductor material which is a $Ga_x Al_y B_{l-x-y} N_z P_{l-z}$-based mixed crystal. The mixed crystal in question preferably has a composition of $x+y=z$, and the orderings of Ga-N, Al-N, and B-P are selectively generated. More specifically, in the second LED, the mixed crystal is used to constitute a p-n junction. The second LED also allows high-luminance blue light emission.

A compound semiconductor material used for a light-emitting layer of the LED according to the present invention has rarely a suitable substrate, which is transparent with respect to a light-emission wavelength, and can achieve lattice matching. In the present invention, therefore, after a light-emitting layer which constitutes the p-n junction required is grown on a substrate, the substrate is removed. Then, the resultant LED chip is mounted on a header, using as a light output surface one from which the substrate has been removed. In this way, a reduction in the light output efficiency due to the presence of the substrate is prevented, and the amount of stress applied to the light-emitting layer is decreased. As a result, a high-luminance, high-reliability LED for emitting blue light is obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrates presently preferred embodiments of the invention and, together with the general description given above and the detailed description of the preferred embodiments given below serve to explain the principles of the invention.

FIG. 1 is a sectional view showing a blue LED using superlattice layers according to an embodiment of the present invention;

FIG. 2 is a sectional view showing an MOCVD apparatus used to manufacture the LED in FIG. 1;

FIG. 3 is a view showing a state wherein the blue LED chip in FIG. 1 is buried in a resin case;

FIG. 6 is a sectional view showing a blue LED with a DH structure according to an embodiment using a mixed crystal layer;

FIG. 9 is a sectional view showing a blue LED according to an embodiment using a mixed crystal layers as a light-emitting layer, and including a reflection layer with a superlattice structure;

FIG. 12 is a sectional view showing a blue LED according to another embodiment using a mixed crystal layers as a reflection layer;

FIG. 14 is a sectional view showing a blue LED with a DH structure according to an embodiment including a transparent contact layer on the light-emitting layer;

FIG. 16 is a sectional view showing a blue LED with a DH structure according to an embodiment using a mixed crystal layer as a light-emitting layer, and including a transparent contact layer on the light-emitting layer;

FIGS. 17A and 17B are views for explaining a selective doping method effective for the present invention;

DETAILED DESCRIPTION OF THE PREFERRED EMBODIMENTS

Figure 4:
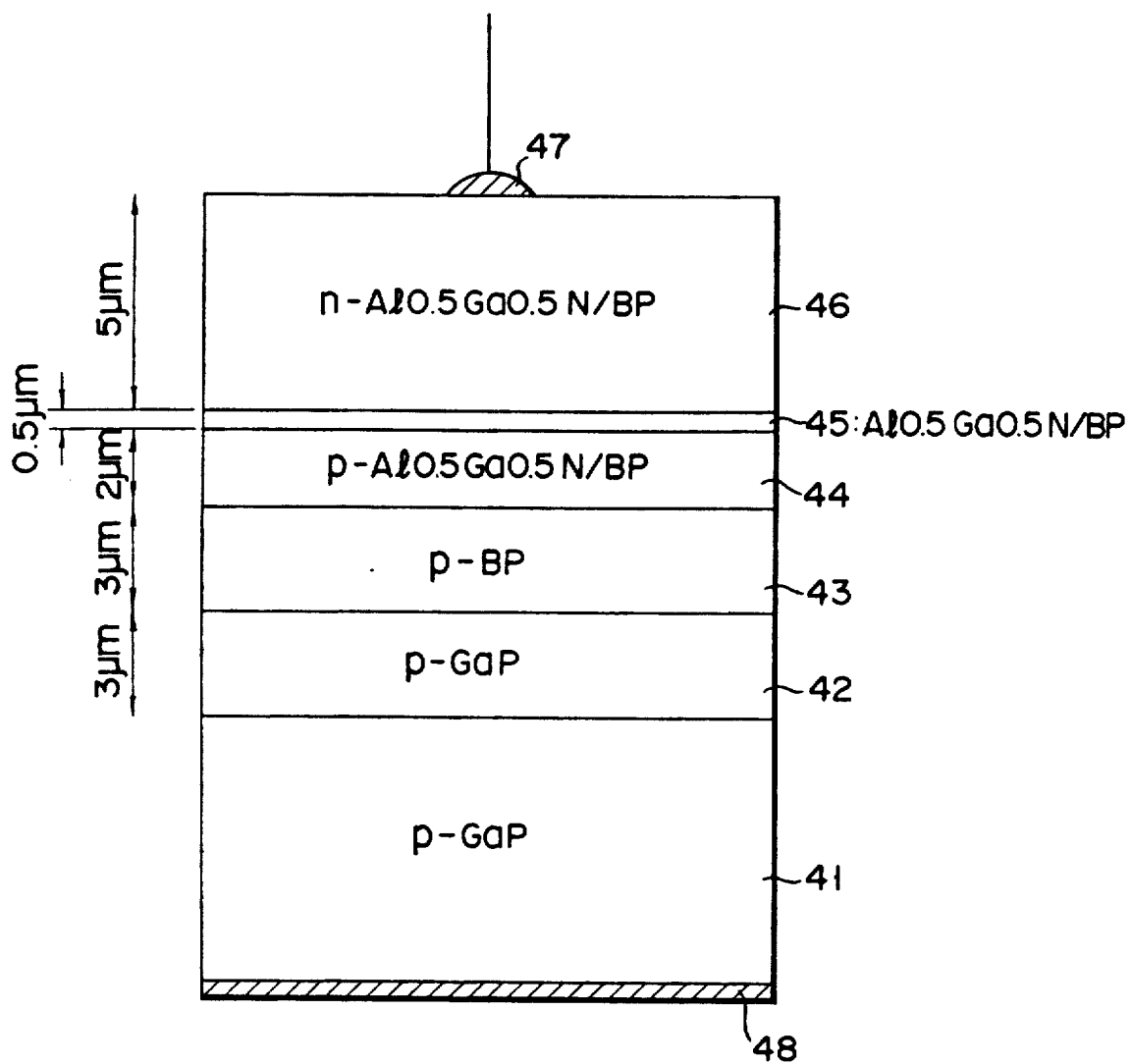
FIG. 4 is a sectional view showing a blue LED with a DH structure according to another embodiment using a superlattice layer.

FIG. 1 shows a sectional structure of an LED according to an embodiment. An Si-doped n-type GaP layer 12 and an Si-doped n-type BP layer 13 are formed on an Si-doped n-type GaP substrate 11 as buffer layers. A plurality of $Ga_{0.5}Al_{0.5}N$ layers and BP layers are alternately stacked on the n-type BP layer 13 to form an Si-doped n-type $Ga_{0.5}Al_{0.5}N$/BP superlattice layer 14. An Mg-doped p-type $Ga_{0.5}Al_{0.5}N$/BP superlattice layer 15 with the same superlattice structure formed on the n-type $Ga_{0.5}Al_{0.5}N$/BP superlattice layer 14. A p-n junction formed by the n- and p-type $Ga_{0.5}Al_{0.5}N$/BP superlattice layers 14 and 15 constitutes a light-emitting. Ohmic electrodes 16 and 17 consisting of In are respectively formed on the upper and lower surfaces of the LED chip formed in this manner.

This LED is manufactured using metal organic chemical vapor deposition (MOCVD). This manufacturing method will be described hereinafter in detail.

FIG. 2 shows a metal organic chemical vapor deposition (MOCVD) apparatus, having a plurality of reaction tubes, which is used in this embodiment. Reaction tubes 21, 22, and 23 are vertically mounted in one chamber 24 to extend through an upper lid of the chamber 24. These reaction tubes 21, 22, and 23 are made of quartz. Required source gases are supplied from gas supply ports formed in upper portions of the tubes. A substrate 25 is placed on a graphite susceptor 26, and is disposed in the chamber 24 to oppose openings of the reaction tubes 21, 22, and 23. The substrate 25 is heated to a high temperature by an external RF coil 27. The susceptor 26 is mounted on a quartz holder 28. The quartz holder 28 is driven by a drive shaft connected thereto through a magnetic fluid seal to move under the reaction tubes 21, 22, and 23 at high speed. This driving is performed by a computer-controlled motor (not shown) which is externally arranged. A thermocouple 30 is arranged in the central portion of the susceptor to monitor a temperature of a part immediately under the substrate 25 and to output the temperature. A slip ring is used for a cord of the thermocouple to prevent a twist caused by a turn. The source gases supplied from the reaction tubes 21, 22, and 23 are pushed out by high-speed down flow of hydrogen gas supplied from injection ports 31 formed on an upper portion of the chamber 24. The pushed source gases are exhausted from an exhaust port 32 by a rotary pump while mixing of the gases is suppressed as much as possible.

In such an MOCVD apparatus, when desired source gases are flowed through the reaction tubes 21, 22, and 23, and the substrate 25 is moved by the computer-controlled motor, a multilayered structure with an arbitrary composition can be formed on the substrate 25 at an arbitrary stacking periodicity. In this system, a quick change in concentration which cannot be performed in a gas switching method can be easily realized. In addition, gases need not be switched at high speed to form a steep heterojunction in this system. Therefore, a problem of low decomposition rate of $NH_3$ or $PH_3$, which is a source gas, can be solved by setting a low gas flow rate.

The conditions in the manufacture of the LED shown in FIG. 1 using the above MOCVD apparatus will be described hereinafter in detail. The source gases are trimethylaluminum (TMA) or trimethylgallium (TMG) which is a methyl-radical organometallic compound, triethylboron (TEB), ammonia ($NH_3$), and phosphine ($PH_3$). The substrate temperature is about 850° to 1,150° C., a pressure in the chamber is 0.3 atm., and a total flow rate of the source gases is 1 l/min. The flow rate of each gas is set so that a growth rate is 1 $\mu$m/h. The flow rate of each gas is set such that TMA: $1 \times 10^{-6}$ mol/min, TMG: $1 \times 10^{-6}$ mol/min, TEB: $1 \times 10^{-6}$ mol/min, $PH_3$: $5 \times 10^{-4}$ mol/min, and $NH_3$: $1 \times 10^{-3}$ mol/min. Mg and Si were used as p- and n-type dopants. Doping of these impurities is performed by mixing silane ($SiH_4$) and cyclopentadienyl magnesium ($CP_2Mg$) with the source gases.

A detailed element structure will be described below. The n-type GaP substrate 11 is an Si-doped substrate having a carrier concentration of $1 \times 10^{18}$ atoms/cm$^3$. The n-type GaP layer 12 is an Si-doped layer having a carrier concentration of $5 \times 10^{17}$ atoms/cm$^3$ and a thickness of 3 gm. The n-type BP layer 13 is an Si-doped layer having a carrier concentration of $2 \times 10^{17}$ atoms/cm$^3$ and a thickness of 3 $\mu$m. In the n-type $Ga_{0.5}Al_{0.5}N$/BP superlattice layer 14, 13-Å thick $Ga_{0.5}Al_{0.5}N$ layers and 7-Å thick BP layers are alternately stacked with a stacking periodicity of 20 Å. The superlattice layer 14 has a carrier concentration of $1 \times 10^{17}$ atoms/cm$^3$ and a thickness of 3 $\mu$m. In the p-type $Ga_{0.5}Al_{0.5}N$/BP superlattice layer 15, 10-Å thick $Ga_{0.5}Al_{0.5}N$ layers and 10-Å thick BP layers are alternately stacked with a stacking periodicity of 20 Å. The superlattice layer 15 has a carrier concentration of $2 \times 10^{16}$ atoms/cm$^3$ and a thickness of 5 $\mu$m.

FIG. 3 shows a state wherein an LED chip 31 according to this embodiment is buried in a resin case 32 also serving as a lens. Reference numerals 33 and 34 denote internal and external leads, respectively.

It is confirmed that the LED of this embodiment emits blue light of about 10 mcd while being buried in the resin case.

FIG. 4 is a sectional view showing an LED with a double heterojunction (DH) structure according to an embodiment. A p-type GaP buffer layer 42 and a p-type BP buffer layer 43 are sequentially formed on a p-type GaP substrate 41. P-type, non-doped, and n-type $Ga_{0.5}Al_{0.5}N$/BP superlattice layers 44, 45, and 46 are sequentially stacked on the buffer layers. Ohmic electrodes 47 and 48 are respectively formed on the upper and lower surfaces of the element wafer.

This LED is also manufactured using the MOCVD apparatus shown in FIG. 2 under substantially the same conditions as those in the above embodiment.

A detailed element structure will be described below. The GaP substrate 41 is a Zn-doped substrate having a carrier concentration of $5 \times 10^{17}$ atoms/cm$^3$. The p-type GaP buffer layer 42 having a thickness of 3 $\mu$m and a carrier concentration of $2 \times 10^{17}$ atoms/cm$^3$ and the p-type BP buffer layer 43 having a thickness of 3 $\mu$m and a carrier concentration of $1 \times 10^{17}$ atoms/cm$^3$ are sequentially formed on the substrate 41. The p-type $Ga_{0.5}Al_{0.5}N$/BP superlattice layer 44 has a structure obtained by alternately stacking 13-Å thick $Ga_{0.5}Al_{0.5}N$ layers and 7-Å thick BP layers at a stacking periodicity of 20 Å. The layer 44 has a band gap of 3.0 eV, a carrier concentration of $1 \times 10^{17}$ atoms/cm$^3$, and a thickness of 2 $\mu$m. The non-doped $Ga_{0.5}Al_{0.5}N$/BP superlattice layer 45 has a structure obtained by alternately stacking 10-Å thick $Ga_{0.5}Al_{0.5}N$ layers and 10-Å thick BP layers with a stacking periodicity of 20 Å. The layer 45 has a band gap of 2.7 eV, a carrier concentration of $2 \times 10^{16}$ atoms/cm$^3$, and a thickness of 0.5 $\mu$m. The n-type $Ga_{0.5}Al_{0.5}N$/BP superlattice layer 46 has a structure obtained by alternately stacking 13-Å thick $Ga_{0.5}Al_{0.5}N$ layers and 7-Å BP layers with a stacking periodicity of 20 Å. The layer 46 has a band gap of 3.0 eV, a carrier concentration of $1 \times 10^{17}$ atoms/cm$^3$, and a thickness of 5 $\mu$m.

When the LED chip of this embodiment is resin-sealed in the same manner as in the above embodiment, a higher-luminance blue light emission was confirmed.

In the above embodiments, each superlattice layer of the light-emitting layer which constitutes a p-n junction has a stacking periodicity of 20 Å, and a ratio of film thicknesses of the $Ga_{0.5}Al_{0.5}N$ layer and the BP layer is set to be 1:1 or 13:7. The above stacking periodicity and the film thickness ratio can be changed as needed. In this case, attention must be paid to the following points. When the stacking periodicity is 50 Å or more, localized electrons are conspicuous to increase a resistance of the superlattice layer. In addition, when the thickness of the $Ga_{0.5}Al_{0.5}N$ layer is set to be smaller than that of the BP layer, a band structure is changed from a direct transition type to an indirect transition type to decrease light emission efficiency. Although a case wherein Ga and Al in the $Ga_xAl_{1-x}N$ layer are contained in a ratio of 1:1 has been described above, the composition ratio is not limited thereto. In addition, in the embodiment in FIG. 4, a band gap of the superlattice layer is changed by changing the ratio of the film thicknesses of the $Ga_xAl_{1-x}N$ layer and the BP layer while the composition ratio is kept constant. However, the band gap can be changed by changing the composition ratio of Ga and Al.

An embodiment using a $Ga_xAl_yB_{1-x-y}N_zP_{1-z}$ mixed crystal layer ($0 \leq x, y \leq 1, z-x+y$) with ZB structure as a material of a light-emitting layer which constitutes a p-n junction of the LED in place of the $Ga_xAl_{1-x}N/BP$ superlattice layer will be described hereinafter. Upon crystal growth using the MOCVD apparatus shown in FIG. 2, when a substrate is not moved and a source gas mixture is supplied from one reaction tube, the above mixed crystal layer can be obtained. Note that in order to prevent interaction between the source gases, the gases may be preferably mixed immediately before the reaction tube.

Figure 5:
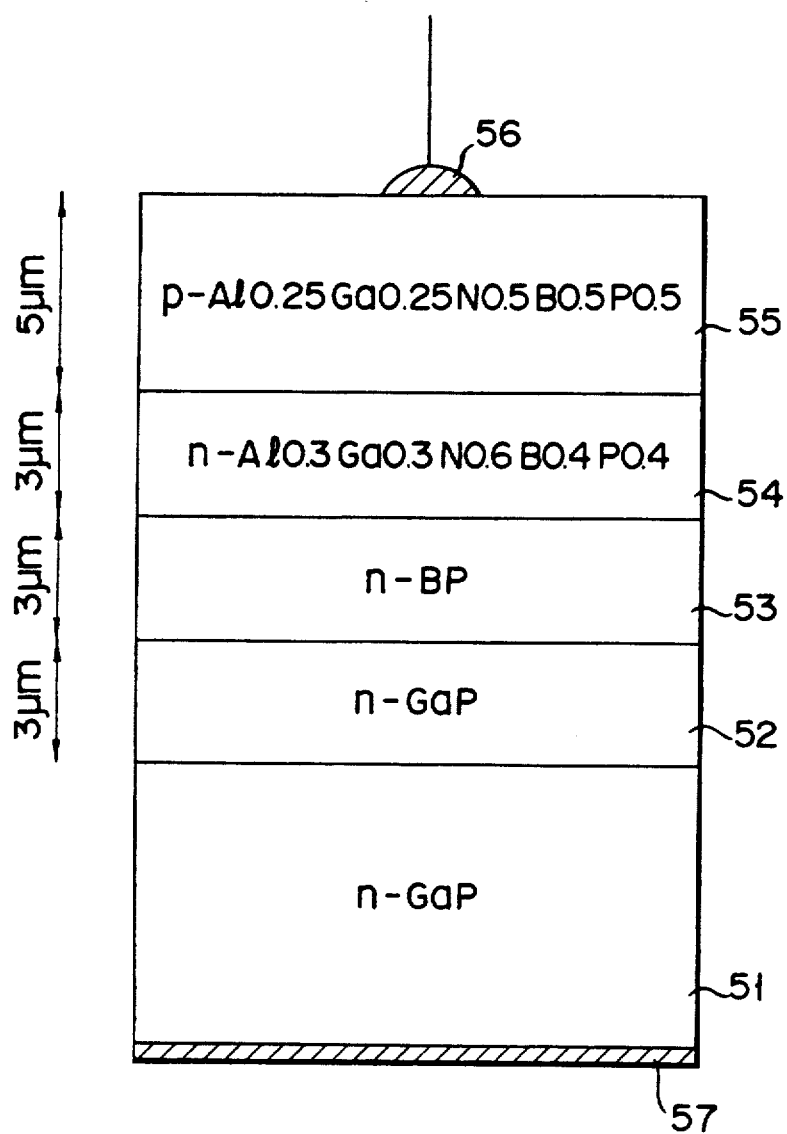
FIG. 5 is a sectional view showing a blue LED according to an embodiment using a mixed crystal layer.

FIG. 5 is a sectional view of an LED with a single hetero structure according to the above embodiment. Si is doped in a GaP substrate 51 at a carrier concentration of $1 \times 10^{18}$ atoms/cm$^3$. An Si-doped n-type GaP buffer layer 52 having a carrier concentration of $5 \times 10^{17}$ atoms/cm$^3$ and a thickness of 3 μm, and an Si-doped n-type BP buffer layer 53 having a carrier concentration of $2 \times 10^{17}$ atoms/cm$^3$ and a thickness of 3 μm are formed on the substrate 51. An n-type $Ga_{0.3}Al_{0.3}N_{0.6}B_{0.4}P_{0.4}$ mixed crystal layer 54 is formed on the buffer layers. A p-type $Ga_{0.25}Al_{0.25}N_{0.5}B_{0.5}P_{0.5}$ mixed crystal layer 55 is formed on the layer 54. The n-type mixed crystal layer 54 is an Si-doped layer having a carrier concentration of $1 \times 10^{17}$ atoms/cm$^3$ and a thickness of 3 μm, and the p-type mixed crystal layer 55 is an Mg-doped layer having a carrier concentration of $2 \times 10^{16}$ atoms/cm$^3$ and a thickness of 5 μm. Ohmic electrodes 56 and 57 are respectively formed on the upper and lower surfaces of the element chip.

Thus, when a p-n junction is formed using a mixed crystal layer of GaN, AlN, and BP, a wide band gap of the mixed crystal and easy doping control realizes a high-luminance blue LED.

FIG. 6 shows an embodiment of an LED with a DH structure using the same mixed crystal layer as in the above embodiment. A p-type GaP buffer layer 62 and a p-type BP buffer layer 63 are formed on a p-type GaP substrate 61. A p-type $Ga_{0.3}Al_{0.3}N_{0.6}B_{0.4}P_{0.4}$ mixed crystal layer 64 having a band gap of 3 eV, a non-doped $Ga_{0.25}Al_{0.25}N_{0.5}B_{0.5}P_{0.5}$ mixed crystal layer 65 having a band gap of 2.7 eV, and an n-type $Ga_{0.3}Al_{0.3}N_{0.6}B_{0.4}P_{0.4}$ mixed crystal layer 66 having a band gap of 3 eV are sequentially stacked on the buffer layers 62 and 63. The p-type mixed crystal layer 63 has a carrier concentration of $1 \times 10^{17}$ atoms/cm$^3$ and a thickness of 2 μm. The non-doped mixed crystal layer 64 has a thickness of 0.5 μm, and the n-type mixed crystal layer 65 has a carrier concentration of $1 \times 10^{17}$ atoms/cm$^3$ and a thickness of 5 μm.

In this embodiment, high-luminance blue light emission can be realized.

Although a p-n junction serving as a light-emitting layer is formed on the GaP substrate in the above embodiments, lattice mismatching between the substrate and the light-emitting layer is large. Although the GaP and BP layers are inserted as buffer layers, dislocations are pronounced in the light-emitting layer, or stress is applied to the layers, thereby degrading the reliability. Light which propagates toward the substrate is absorbed in the substrate, and a sufficient external light emission efficiency cannot be achieved. An embodiment in which the above problems can be solved will be described hereinafter.

Figure 7:
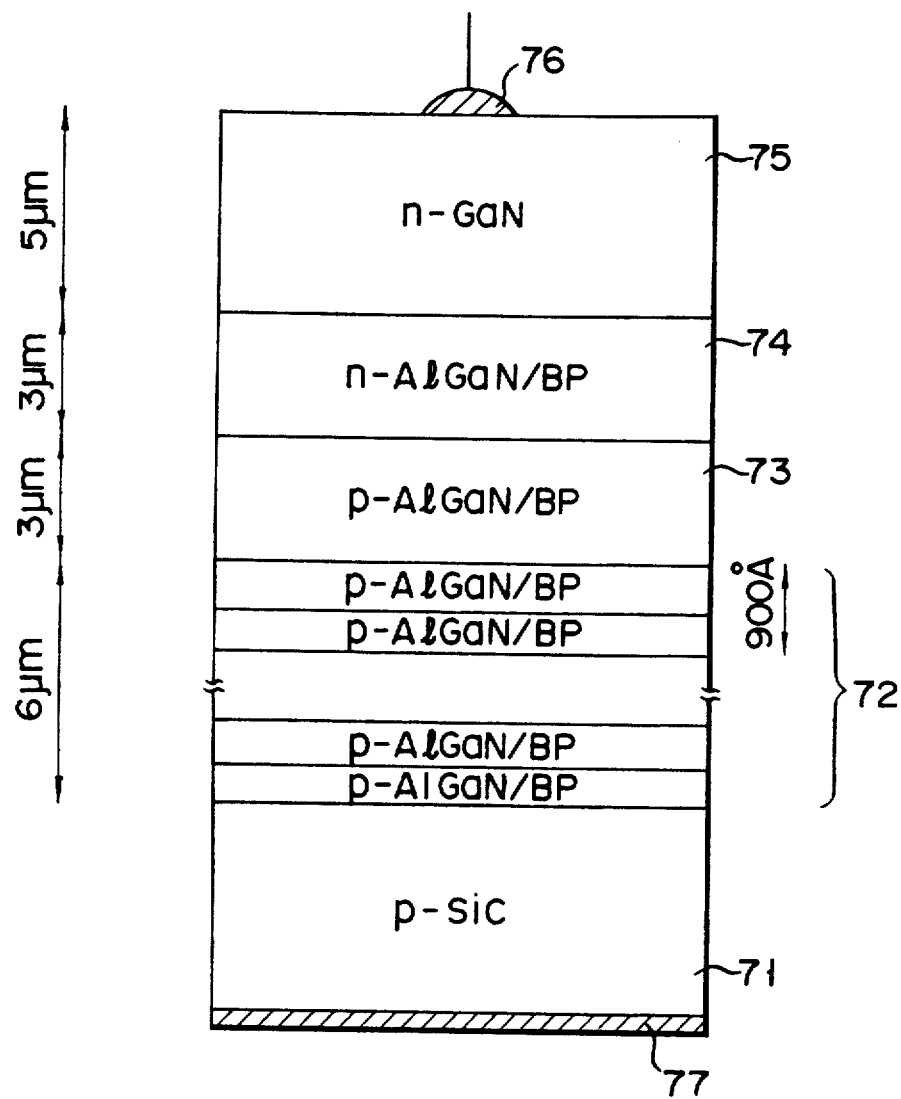
FIG. 7 is a sectional view showing a blue LED according to an embodiment including a reflection layer with a superlattice structure.

FIG. 7 is a sectional view of an LED according to the above embodiment. An SiC substrate 71 consisting of a ZB-type crystal, and having a lattice constant substantially equal to that of a light-emitting layer is used in this embodiment. A light-reflection layer 72 having a $Ga_xAl_{1-x}N/BP$ superlattice multilayered structure is formed on the substrate 71. P- and n-type $Ga_xAl_{1-x}N/BP$ superlattice layers 73 and 74 are stacked on the light-reflection layer 72. A WZ-type GaN contact layer 75 is formed on the super lattice layer 74. Ohmic electrodes 76 and 77 are respectively formed on the upper and lower surfaces of the element.

This LED structure can be formed using the MOCVD apparatus shown in FIG. 2 in the same manner as in the above embodiments. A detailed element structure will be described hereinafter. The p-type SiC substrate 71 is an Al-doped substrate having a carrier concentration of $3 \times 10^{17}$ atoms/cm$^3$. The light-reflection layer 72 has a structure obtained by alternately stacking a plurality of $Ga_xAl_{1-x}N/BP$ superlattice layers of two types having different average compositions. The stacking periodicity of these lattice layers is substantially half a wavelength of radiated light, i.e., 900 Å. The reflection layer 72 has a carrier concentration of $2 \times 10^{17}$ atoms/cm$^3$ and a thickness of 6 μm. The p-type $Ga_{0.5}Al_{0.5}N/BP$ superlattice layer 73 (Mg-doped, carrier concentration: $1 \times 10^{17}$ atoms/cm$^3$, thickness: 3 μm, stacking periodicity: 13 Å/7 Å), and the n-type $Ga_{0.5}Al_{0.5}N/BP$ super lattice layer 74 (Si-doped, a carrier concentration: $2 \times 10^{16}$ atoms/cm$^3$, thickness: 3 μm, stacking periodicity: 10 Å/10 Å) are sequentially formed on the reflection layer 72. The contact layer 75 has a thickness of 5 μm and a band gap of 3.4 eV A major part of the layer 75 consists of WZ-type GaN.

According to this embodiment, since the SiC substrate and the reflection layer consisting of superlattice layers are used, dislocation in a light-emitting layer can be suppressed. In addition, light radiated from the light-emitting layer to the substrate is effectively reflected to the upper surface side by the reflection layer, and is output. As a result, high luminance can be obtained. In practice, when the element chip of this embodiment was sealed in a resin case as in FIG. 3, blue light emission of 20 mcd was confirmed.

Figure 8:
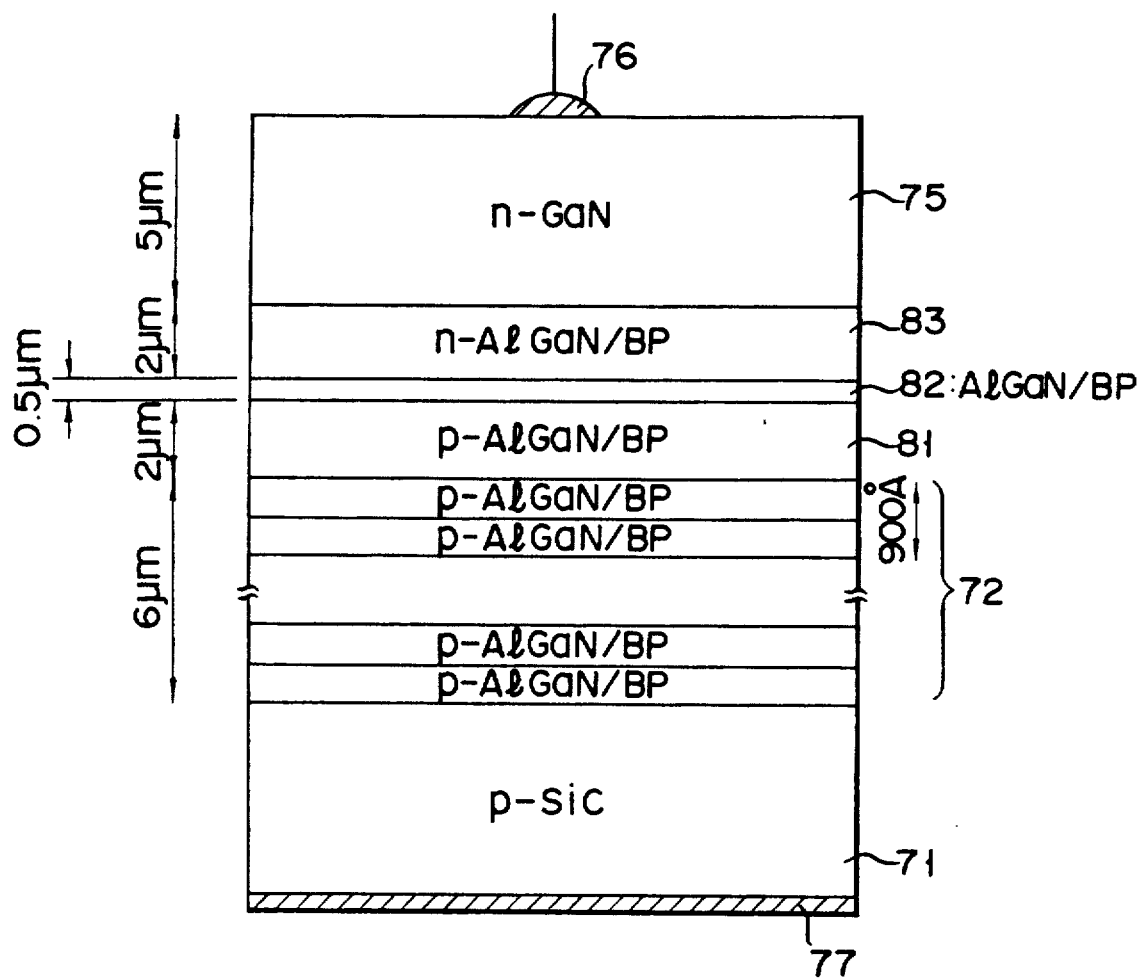
FIG. 8 is a sectional view showing a blue LED with a DH structure according to an embodiment including a reflection layer with a superlattice structure.

FIG. 8 shows a modification of the structure shown in FIG. 7. In FIG. 8, a light-emitting layer has a DH structure. More specifically, the light-reflection layer 72 having a superlattice structure is formed on the SiC substrate 71 in the same manner as in FIG. 7. A p-type $Ga_xAl_{1-x}N/BP$ superlattice layer 81 (band gap: 3 eV, carrier concentration: $2 \times 10^{17}$ atoms/cm$^3$ thickness: 2 μm), a non-doped $Ga_xAl_{1-x}N/BP$ superlattice layer 82 (band gap: 2.7 eV, carrier concentration: $2 \times 10^{16}$ atoms/cm$^3$ thickness: 0.5 μm), and an n-type $Ga_xAl_{1-x}N/BP$ superlattice layer 83 (band gap: 3 eV, carrier concentration: $1 \times 10^{17}$ atoms/cm$^3$, thickness: 2 μm) are sequentially formed on the light-reflection layer 72. More specifically, the p- and n-type superlattice layers 81 and 83 have periodic stacking structures of $Ga_{0.5}Al_{0.5}N$ (13 Å)/BP (7 Å) layers, and the non-doped superlattice layers 82 have a periodic stacking structure of $Ga_{0.5}Al_{0.5}N$ (10 Å)BP (10 Å). The structures except for the above description are the same as those in FIG. 7. A detailed manufacturing method and source gases are substantially the same as in the above embodiment.

In this embodiment, high-luminance blue light emission can be realized as in the above embodiments.

FIG. 9 is a sectional view showing an LED according to an embodiment having a light-reflection layer with a superlattice structure and a contact layer, and using a mixed crystal layer as a p-n junction which constitutes a light-emitting layer. In this embodiment, a p-type GaP substrate 91 is used, and a reflection layer 92 obtained by alternately stacking $Ga_xAl_{l-x}$/BP superlattice layers of two types having different compositions is formed on the substrate 91 in the same manner as in the above embodiments. P- and n-type $Ga_xAl_yB_{l-x-y}N_zP_{l-z}$ mixed crystal layers 93 and 94 are sequentially formed on the reflection layer 92, and a GaN contact layer 95 is formed thereon. Ohmic electrodes 96 and 97 are respectively formed on the upper and lower surfaces of the element. For example, the p-type mixed crystal layer 93 is an Mg-doped $Ga_{0.3}Al_{0.3}B_{0.4}N_{0.6}P_{0.4}$ layer having a carrier concentration of $1 \times 10^{17}$ atoms/cm$^3$ and a thi 3 μm, and the n-type mixed crystal layer 94 is an Si-doped $Ga_{0.25}Al_{0.25}B_{0.5}N_{0.5}P_{0.5}$ layer having a carrier concentration of $2 \times 10^{16}$ atoms/cm$^3$ and a thickness of 3 μm.

Although a GaP substrate is used in this embodiment, the light-reflection layer 92 having a superlattice structure serves as an effective stress buffer layer. As a result, an excellent p-n junction can be achieved. In addition, the light-reflection layer allows high light output efficiency, thus realizing high-luminance blue light emission.

Figure 10:
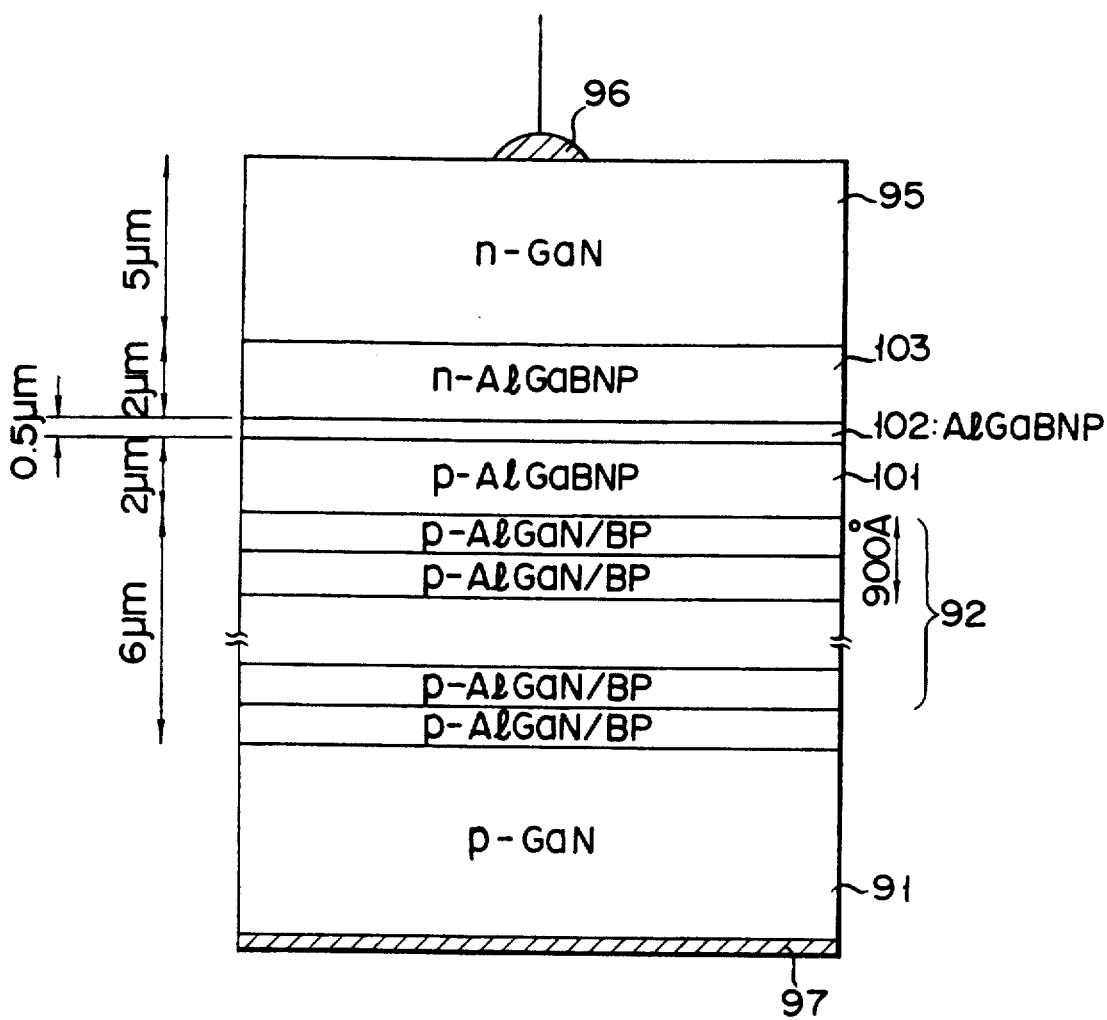
FIG. 10 is a sectional view showing a blue LED with a DH structure according to an embodiment using a mixed crystal layers as a light-emitting layer, and including a reflection layer with a superlattice structure.

FIG. 10 shows an LED with a DH structure according to a modification of the embodiment shown in FIG. 9 using a mixed crystal. The reflection layer 92 having a superlattice structure is formed on the GaP substrate 91 in the same manner as in FIG. 9. P-type, non-doped, and n-type $Ga_xAl_yB_{l-x-y}N_zP_{l-z}$ mixed crystal layers 101, 102, and 103 are sequentially formed on the reflection layer 92. The p-type mixed crystal layer 101 is a $Ga_{0.3}Al_{0.3}B_{0.4}N_{0.6}P_{0.4}$ layer having a band gap of 3 eV, a thickness of 2 μm, and a carrier concentration of $1 \times 10^{17}$ atoms/cm$^3$. The non-doped mixed crystal layer 102 is a $Ga_{0.25}Al_{0.25}B_{0.5}N_{0.5}P_{0.5}$ layer having a band gap of 2.7 eV and a thickness of 0.5 μm. The n-type mixed crystal layer 103 is a $Ga_{0.3}Al_{0.3}B_{0.4}N_{0.6}P_{0.4}$ layer having a band gap of 3 eV, a thickness of 2 μm, and a carrier concentration of $5 \times 10^{17}$ atoms/cm$^3$.

In this embodiment, high-luminance blue light emission can be achieved in the same manner as in the above embodiments.

A multilayered structure of mixed crystal can be used as a reflection layer having a superlattice structure in the above embodiments. Such an embodiment will be described hereinafter.

Figure 11:
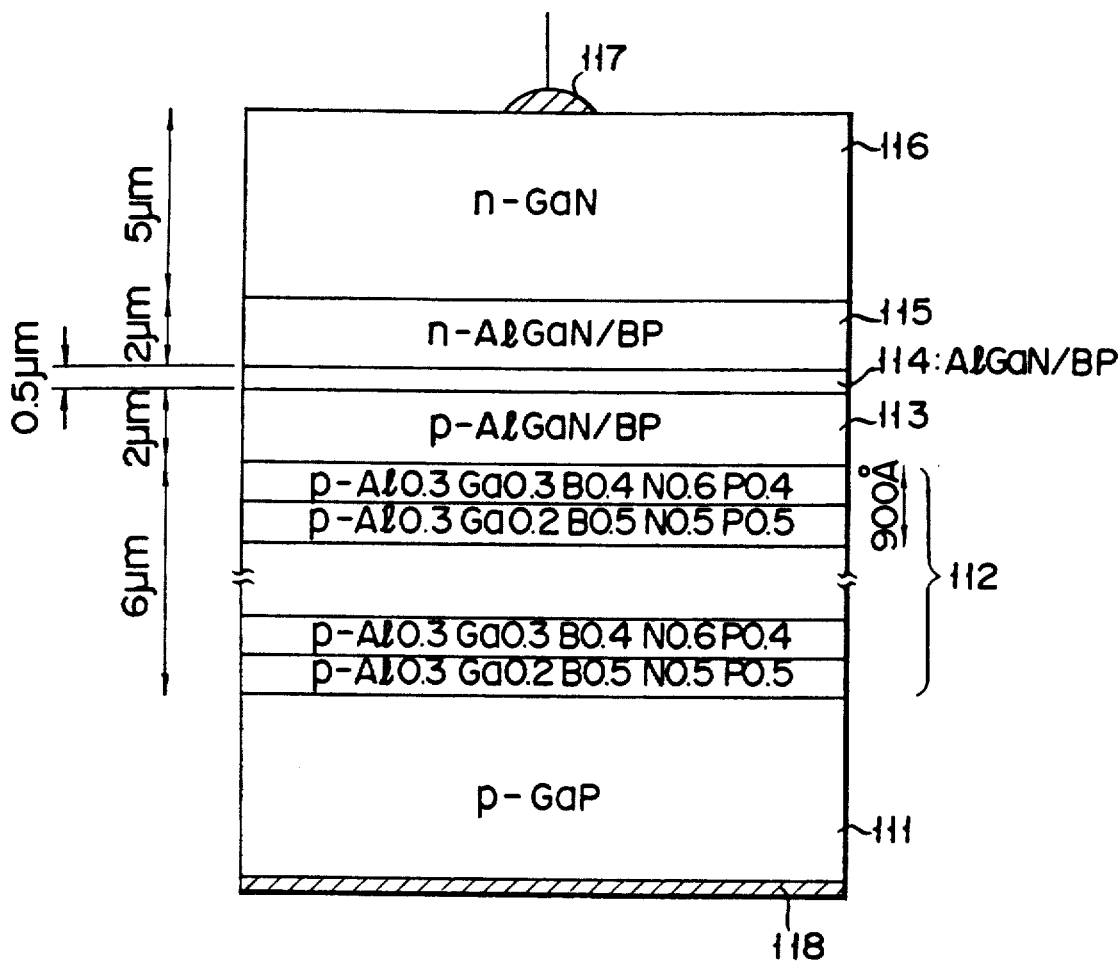
FIG. 11 is a sectional view showing a blue LED with a DH structure according to an embodiment using a mixed crystal layers as a reflection layer.

FIG. 11 shows an LED according to the above embodiment. A light-reflection layer 112 having a multi-layered structure obtained by stacking mixed crystal layers of two types having slightly different compositions is formed on a p-type GaP substrate 111. The mixed crystal layers of the two types are a $Ga_{0.2}Al_{0.3}B_{0.5}N_{0.5}P_{0.5}$ layer and a $Ga_{0.3}Al_{0.3}B_{0.4}N_{0.6}P_{0.4}$ layer. A stacking period of these layers is 900 Å, and a total thickness is 6 μm. P-type, non-doped, and n-type $G_xAl_{l-x}N$/BP superlattice layers 113, 114, and 115 are sequentially formed on the reflection layer 112 to constitute a light-emitting layer having a DH structure. An n-type GaN contact layer 116 is formed on the light-emitting layer. Ohmic electrodes 117 and 118 are respectively formed on the upper and lower surfaces of the element. The structure of a portion which constitutes a p-n junction is the same as that in, e.g., FIG. 8.

In this embodiment, high-luminance blue light emission can be achieved in the same manner as in the above embodiments. A growth rate of the $Ga_xAl_yB_{l-x-y}N_zP_{l-z}$ mixed crystal layer is higher than that of a superlattice structure of the $Ga_xAl_{l-x}N$/BP. Therefore, a thick reflection layer can be formed within a short period of time.

FIG. 12 shows an embodiment in which the light-emitting layer in the embodiment shown in FIG. 11 has a single hetero structure. More specifically, the light-emitting layer is constituted by p- and n-type $Ga_xAl_{l-x}N$/BP superlattice layers 113 and 115. Therefore, the same effect as in the embodiment shown in FIG. 11 can be obtained.

In the embodiments shown in FIGS. 7 to 12, a reflection layer is inserted between a substrate and a light-emitting layer, and a transparent GaN contact layer having a large band gap is formed on the light output side. However, even if the reflection layer is not arranged, the transparent contact layer provides a relatively great effect, and the present invention is effective. Such an embodiment will be described below in detail.

Figure 13:
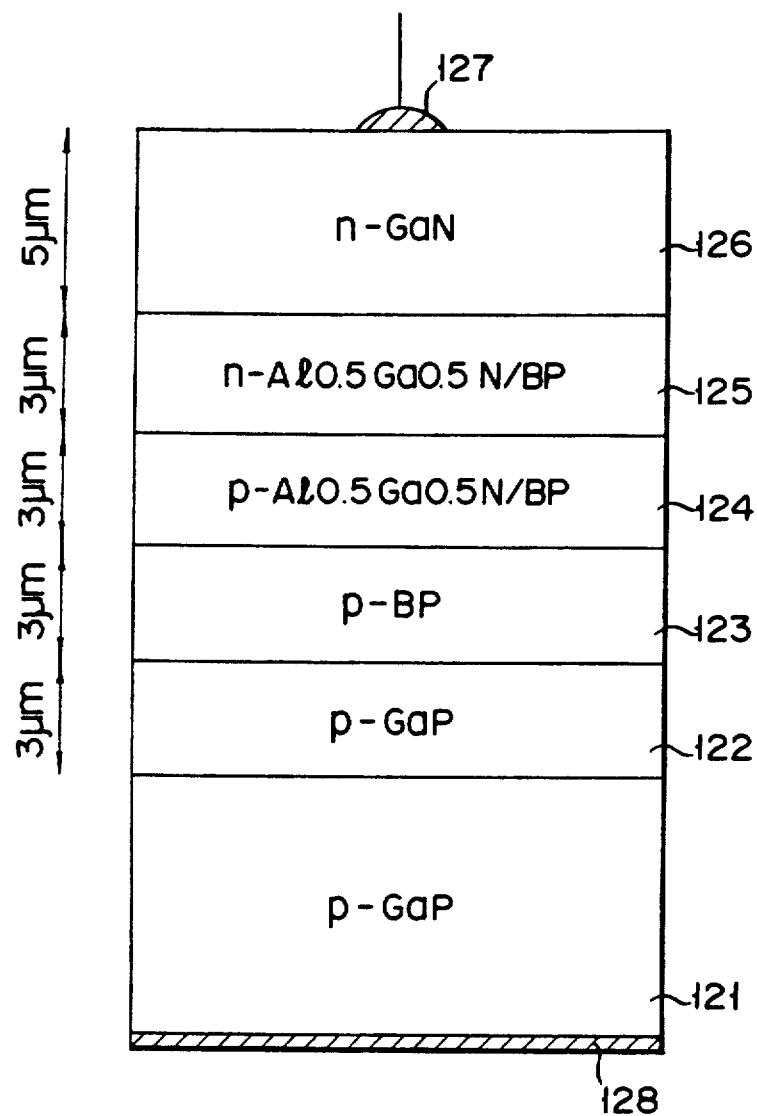
FIG. 13 is a sectional view showing a blue LED according to an embodiment including a transparent contact layer on the light-emitting layer.

FIG. 13 is a sectional view of an LED of the above embodiment. A p-type GaP buffer layer 122 and a p-type BP buffer layer 123 are sequentially formed on a p-type GaP substrate 121. P- and n-type $Ga_{0.5}Al_{0.5}N$/BP superlattice super layers 124 and 125 are sequentially formed on these buffer layers to constitute a p-n junction. An n-type GaN contact layer 126 is formed on the n-type $Ga_{0.5}Al_{0.5}N$/BP superlattice layer 125. Ohmic electrodes 127 and 128 are respectively formed on the upper and lower surfaces of the element.

This element structure can be manufactured using the MOCVD apparatus shown in FIG. 2 under the same conditions as those in the above embodiments. The detailed element structure will be described hereinafter. The GaP substrate 121 is a Zn-doped substrate having a carrier concentration of $5 \times 10^{17}$ atoms/cm$^3$. The p-type GaP and BP buffer layers 122 and 123 are Mg-doped layers each having a carrier concentration of $2 \times 10^{17}$ atoms/cm$^3$ and a thickness of 3 μm. The p-type $Ga_{0.5}Al_{0.5}N$/BP superlattice layer 124 has a periodic stacking structure of $Ga_{0.5}Al_{0.5}N$ (13 Å)/BP (7 Å) layers, a thickness of 3 μm, and a carrier concentration of $2 \times 10^{17}$ atoms/cm$^3$. The n-type $Ga_{0.5}Al_{0.5}N$/BP superlattice layer 125 has a periodic stacking structure of $Ga_{0.5}Al_{0.5}N$ (10 Å)/BP (10 Å) layers, a thickness of 3 μm, and a carrier concentration of $2 \times 10^{16}$ atoms/cm$^3$. A major part of the n-type GaN contact layer 126 is of a WZ type. The layer 126 is an Si-doped layer having a thickness of 5 μm and a carrier concentration of $5 \times 10^{17}$ atoms/cm$^3$.

When the LED chip in this embodiment was resin-sealed as in FIG. 3, blue light emission of about 10 mcd was confirmed.

FIG. 14 shows an LED with a DH structure according to a modification of the embodiment shown in FIG. 13. A difference between the structures in FIGS. 13 and 14 is as follows. In FIG. 14, the thicknesses of the p- and n-type $Ga_{0.5}Al_{0.5}N$/BP superlattice layers 124 and 125 serving as light-emitting layers are set to be 2 μm and a 0.5-μm thick non-doped $Ga_{0.5}Al_{0.5}N/BP$ superlattice layer 131 is inserted between the layers 124 and 125. The p- and n-type $Ga_{0.5}Al_{0.5}N/BP$ superlattice layers 124 and 125 have a periodic stacking structure of $Ga_{0.5}Al_{0.5}N$ (13 Å)/BP (7 Å) layers, and a band gap of 3 eV. The non-doped $Ga_{0.5}Al_{0.5}N/BP$ superlattice layer 131 has a periodic stacking structure of $Ga_{0.5}Al_{0.5}N$ (10 Å)/BP (10 Å) layers, and a band gap of 2.7 eV.

In this embodiment, blue light emission having a luminance slightly higher than that of the embodiment shown in FIG. 13 was confirmed.

Figure 15:
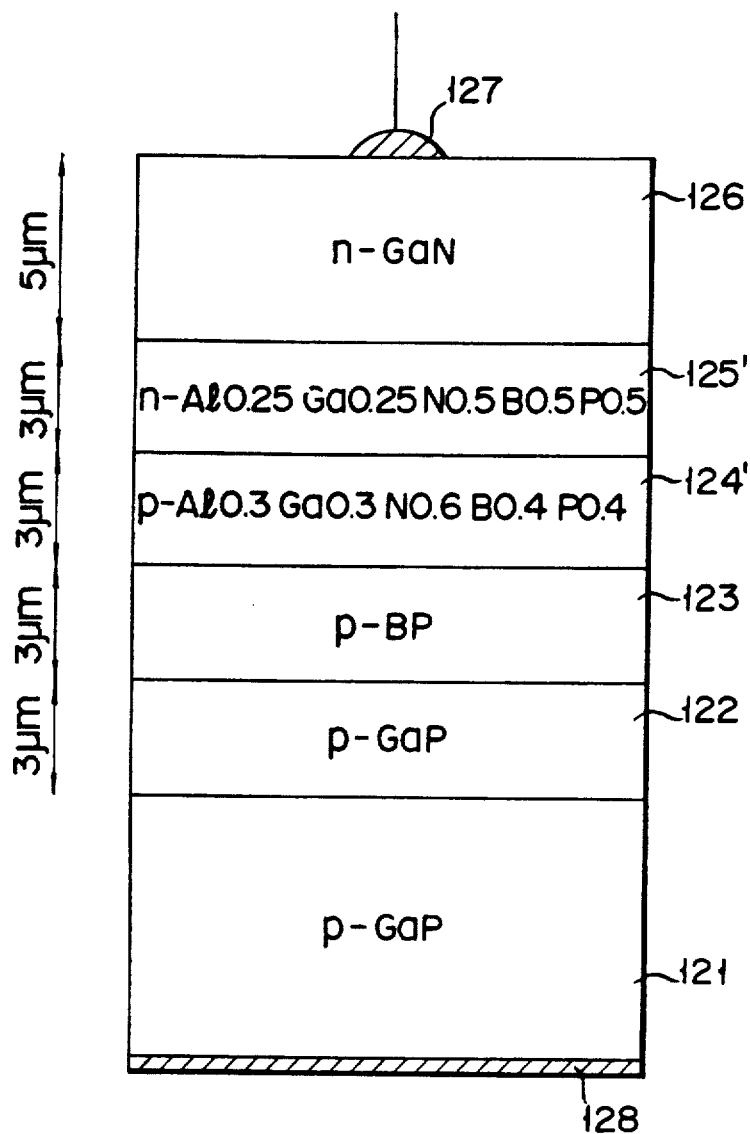
FIG. 15 is a sectional view showing a blue LED according to an embodiment using a mixed crystal layer as the light-emitting layer, and including a transparent contact layer on the light-emitting layer.

FIG. 15 shows an LED according to an embodiment using a $Ga_xAl_yB_{1-x-y}N_zP_{1-z}$ mixed crystal layer as a portion which constitutes a p-n junction in the embodiment shown in FIG. 13 in place of the $Ga_xAl_{1-x}N/BP$ superlattice layer. As described in the above embodiment, these mixed crystal layer can be easily formed using the MOCVD apparatus shown in FIG. 2 by changing an operation. A difference between the structures in FIGS. 15 and 13 is as follows. In FIG. 15, the portions which constitute a p-n junction in FIG. 13 are replaced by a p-type $Ga_{0.3}Al_{0.3}B_{0.4}N_{0.6}P_{0.4}$ mixed crystal layer 124' and an n-type $Ga_{0.25}Al_{0.25}B_{0.5}N_{0.5}P_{0.5}$ mixed crystal layer 125'.

In this embodiment, a high-luminance blue LED can be obtained.

FIG. 16 shows an LED with a DH structure obtained by modifying the embodiment shown in FIG. 15. More specifically, a non-doped $Ga_{0.25}Al_{0.25}B_{0.5}N_{0.5}P_{0.5}$ mixed crystal layer 141 is inserted between the p- and n-type $Ga_{0.3}Al_{0.3}B_{0.4}N_{0.6}P_{0.4}$ mixed crystal layers 124' and 125'. Each of the p- and n-type $Ga_{0.3}Al_{0.3}B_{0.4}N_{0.6}P_{0.4}$ mixed crystal layers 124' and 125' has a thickness of 2 μm and a band gap of 3 eV. The non-doped $Ga_{0.25}Al_{0.25}B_{0.5}N_{0.5}P_{0.5}$ mixed crystal layer 141 has a thickness of 0.5 gm and a band gap of 2.7 eV.

In this embodiment, high-luminance blue light emission can be similarly confirmed.

A compound semiconductor material used for a light-emitting layer in the LED according to the present invention has both low ionizing properties and a ZB structure of BP, and wide band gap characteristics of $Ga_xAl_{1-x}N$. However, a self compensation effect exhibits such that when acceptor impurities are doped in a $Ga_xAl_{1-x}N$ layer, N is removed (point defects), and it is difficult to perform p-type doping at high concentration. In order to solve this problem, it is effective to selectively dope an impurity in only a BP layer having a low ionizing property when a p-type $Ga_xAl_{1-x}N/BP$ superlattice layer is formed. When a p-type impurity is doped in the entire $Ga_xAl_{1-x}N/BP$ superlattice layer, a large number of defects occur due to a self compensation effect in the $Ga_xAl_{1-x}N$ layer. As a result, a high carrier concentration of the entire layer cannot be obtained. In contrast to this, when a p-type impurity is selectively doped in only a BP layer, the self compensation effect does not have an adverse influence, and a defect does not occur. As a result, most of the doped impurity can be effectively activated as carriers.

FIGS. 17A and 17B are views showing the above doping method. FIG. 17A shows p-type doping, and FIG. 17B shows n-type doping. Both the doping methods are based on a superlattice structure obtained by alternately stacking a BP layer and a $Ga_xAl_{1-x}N$ layer at a predetermined period. Mg is doped only in the BP layer in FIG. 17A, and Si is doped only in the $Ga_xAl_{1-x}N$ layer in FIG. 17B.

The growth of a semiconductor layer with a superlattice structure and selective doping of an impurity as described above can be performed by the MOCVD apparatus shown in FIG. 2. A $Ga_xAl_{1-x}N/BP$ superlattice layer is formed under the same conditions as those in the formation of the superlattice layers in the above embodiments. Si is doped in the $Ga_xAl_{1-x}N$ in n-type doping, and Mg is doped in the BP layer in p-type doping. Although Si may be simultaneously doped in both the $Ga_xAl_{1-x}N$ layer and the BP layer in n-type doping, an effective mass in BP is too large to perform n-type doping. It was confirmed that a superlattice semiconductor film having a carrier concentration on the order of $10^{18}$ atoms/cm$^3$ could be obtained in p- and n-type doping when this selective doping was performed. Therefore, the selective doping is effective upon the manufacture of the LED according to the present invention.

Note that a very small amount of Mg may be mixed in the $Ga_xAl_{1-x}N$ layer upon p-type doping.

As described above, in the LED according to the present invention, if a proper substrate which can achieve excellent lattice matching with a light-emitting layer is not present, and light absorption by the substrate is considerable, they present serious problems. In order to solve these problems, the following effective method is proposed. That is, a substrate is used for only crystal growth, and the substrate is etched after desired crystal growth is completed to use a surface from which the substrate is removed as a light output surface. At this time, after a required light-emitting layer is grown, a thick contact layer which is transparent with respect to a light emission wavelength is formed on the surface of the light-emitting layer, and the result ant structure is mounted on a header so that preferably the contact layer side faces down. Such an embodiment will be described hereinafter.

Figures 18, 19:
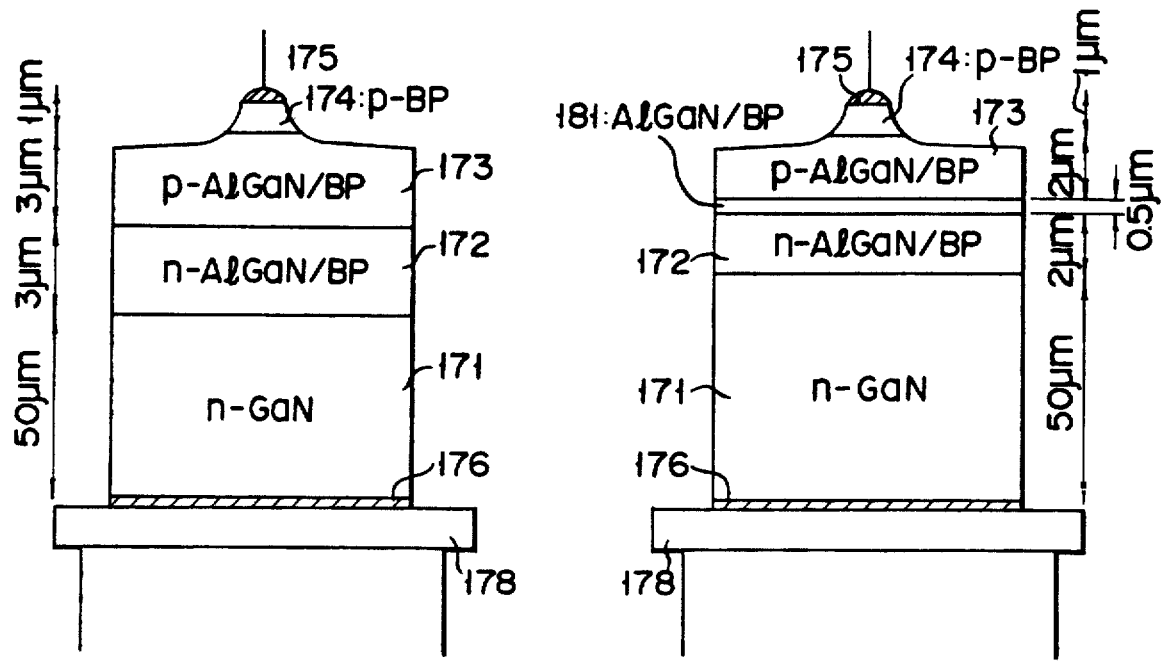
FIG. 18 is a sectional view showing a blue LED according to an embodiment in which a growth substrate is removed to mount the chip.
FIG. 19 is a sectional view showing a blue LED with a DH structure according to an embodiment in which a growth substrate is removed to mount the chip.

FIG. 18 shows an LED according to the above embodiment. In FIG. 18, an LED chip from which a substrate used for crystal growth has been already removed is mounted on a header. This will be described below following the manufacturing steps. For example, a p-type BP buffer layer 174 having a thickness of about 1 μm is formed on a p-type GaP substrate (not shown). N- and p-type $Ga_xAl_{1-x}N/BP$ superlattice layers 172 and 173 are sequentially stacked on the buffer layer 174. The p-type $Ga_xAl_{1-x}N/BP$ superlattice layer 173 is an Mg-doped layer having a carrier concentration of $1 \times 10^{17}$ atoms/cm$^3$. In the layer 173, $Ga_{0.5}Al_{0.5}N$ (13 Å)/BP (7 Å) layers are stacked with a stacking periodicity of 20 Å. The n-type $Ga_xAl_{1-x}N/BP$ superlattice layer 172 is an Si-doped layer having a carrier concentration of $2 \times 10^{16}$ atoms/cm$^3$. In the layer 172, $Ga_{0.5}Al_{0.5}N$ (10 Å)/BP (10 Å) layers are stacked with a stacking periodicity of 20 Å. A GaN contact layer 171 is formed on the obtained p-n junction light-emitting layer to have a sufficient thickness, e.g., 50 gm. The major part of the layer 171 is of a WZ type.

The above-mentioned crystal growth is performed using the MOCVD apparatus shown in FIG. 2 in the same manner as in the above embodiments. The contact layer 171 is of a WZ type and its crystal quality can be poor. However, since the light-emitting layer has been already formed, a degradation in light-emitting efficiency does not occur. After the crystal is grown, the GaP substrate is machine-polished, and is etched by a 2% bromine methanol solution. An ohmic electrode 175 is formed on the BP buffer layer 174. The BP buffer layer 174 is partially etched using the ohmic electrode 175 as a mask. The remaining part of the layer 174 layer serves as a contact layer. The obtained LED chip is mounted on a header 178 through an n-side ohmic electrode 176 so that the GaN contact layer 171 side faces down.

When this LED was buried in a resin lens, blue light emission of about 20 mcd was confirmed.

FIG. 19 shows an LED with a DH structure obtained by modifying the embodiment in FIG. 18. The basic structure and manufacturing method in FIG. 19 are the same as in FIG. 18. A difference between FIGS. 18 and 19 will be described below. In this embodiment, a non-doped $Ga_xAl_{1-x}N/BP$ superlattice layer 181 is inserted between the p- and n-type $Ga_xAl_{1-x}N/BP$ superlattice layers 173 and 172 to realize a DH structure. More specifically, the p-type $Ga_xAl_{1-x}N/BP$ superlattice layer 173 has a band gap of 3 eV, a carrier concentration of $1 \times 10^{17}$ atoms/cm$^3$, and a thickness of 2 μm. The n-type $Ga_xAl_{1-x}N/BP$ superlattice layer 172 has a band gap of 3 eV, a carrier concentration of $2 \times 10^{16}$ atoms/cm$^3$, and a thickness of 2 μm. The non-doped $Ga_xAl_{1-x}N/BP$ layer 181 has a band gap of 2.7 eV and a thickness of 0.5 gm. The band gap is set by ratio of the film thicknesses of the $Ga_xAl_{1-x}N$ layer and the BP layer which constitute the superlattice layer in the same manner as in the above embodiments.

According to this embodiment, blue light emission with a higher luminance can be realized.

Figure 20:
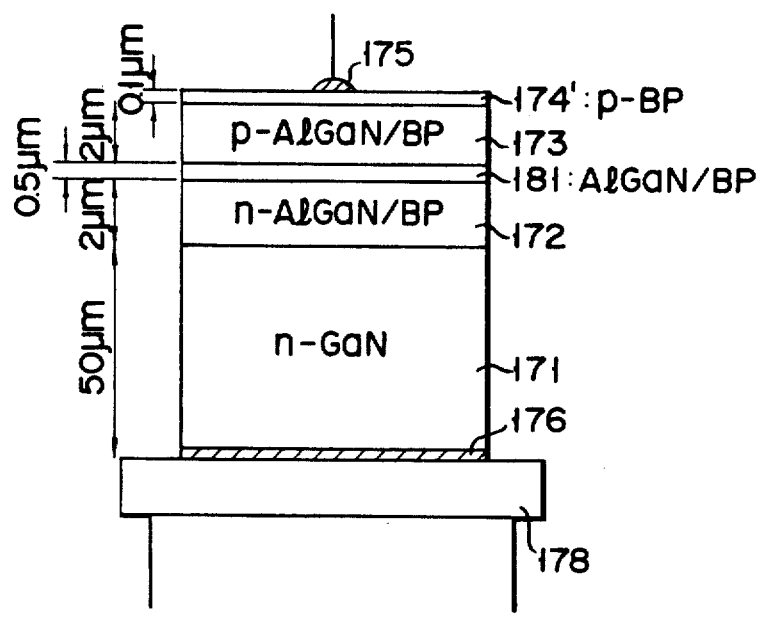
FIG. 20 is a sectional view showing a blue LED with a DH structure according to another embodiment in which a growth substrate is removed to mount the chip.

FIG. 20 is a modification of the embodiment shown in FIG. 19. In this modification, a BP buffer layer 174' is formed on a substrate to have a small thickness, e.g., about 0.1 μm, with which light absorption is negligible. The buffer layer 174' is left. In this embodiment, substantially the same effect as in the above embodiments can be obtained.

Figure 21:
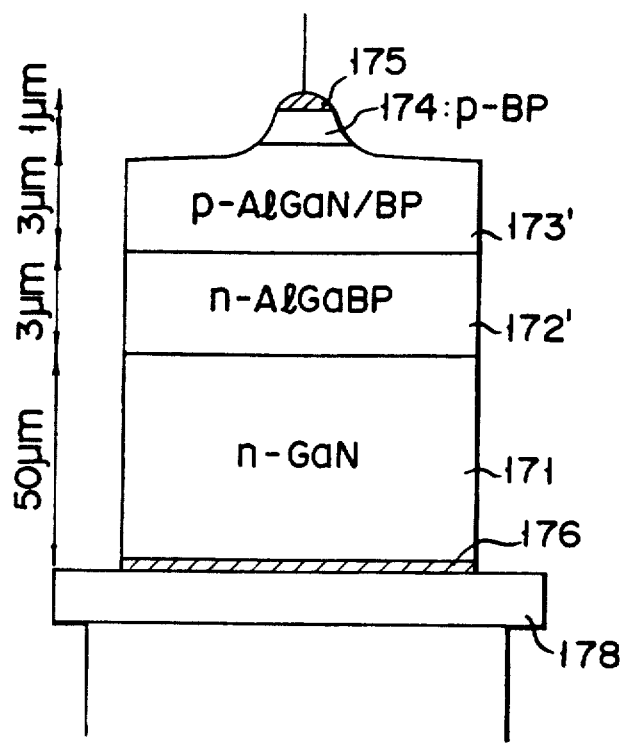
FIG. 21 is a sectional view showing a blue LED according to an embodiment which uses a mixed crystal layer as a light-emitting layer, and in which a growth substrate is removed to mount the chip.
Figure 22:
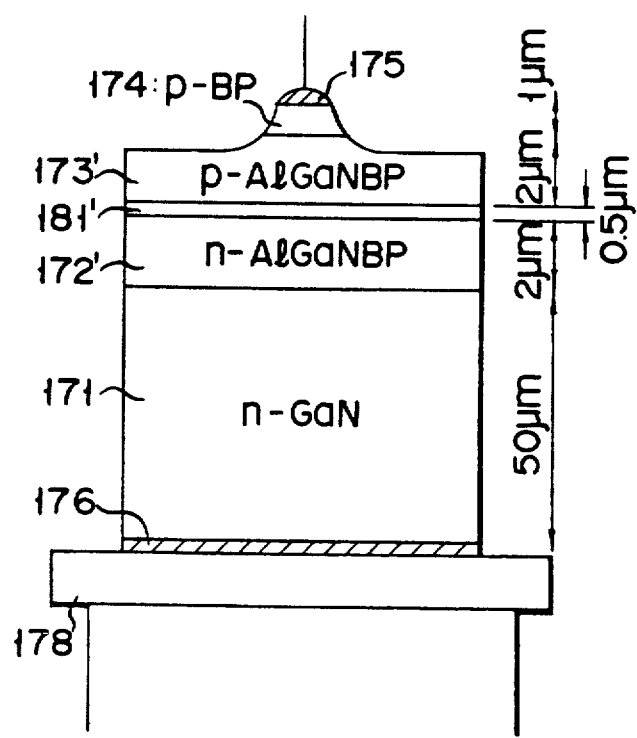
FIG. 22 is a sectional view showing a blue LED with a DH structure according to an embodiment which uses a mixed crystal layer as the light-emitting layer, in which a growth substrate is removed to mount the chip.

FIGS. 21 and 22 show LEDs according to an embodiment in which mixed crystal layers are used as a p-n junction serving as a light-emitting layer in the structure in FIGS. 18 and 19, respectively. More specifically, in FIG. 21, n- and p-type $Ga_xAl_{y1-x-y}N_zP_{1-z}$ mixed crystal layers 172' and 173' (ZB type) are respectively used in place of the n- and p-type $Ga_xAl_{1-x}N/BP$ superlattice layers 172 and 173 in FIG. 18. The layers 172' and 173' have average compositions which are equivalent to those of the layers 172 and 173, respectively. In FIG. 22, the n-type, non-doped, and p-type $Ga_xAl_yB_{1-x-y}N_zP_{1-z}$ mixed crystal layers 172', 181', and 173' (ZB type) are respectively used in place of the n-type, non-doped, and p-type $Ga_xAl_{1-x}N/BP$ superlattice layers 172, 181, and 173 in FIG. 19. The layers 172', 181', and 173' have average compositions equivalent to those of the layers 172, 181, and 173.

In these embodiments, high-luminance blue light emission can similarly be realized.

The present invention is not limited to the above embodiments. For example, although a case wherein a composition is $x+y-z$ ($x=y=0.25, 0.3$) in the embodiments using mixed crystals has been described above, the composition is not limited thereto. When this mixed crystal is used, a sum or ratio of x and g is changed freely to set the width of a band gap. However, if the average composition of the light-emitting layer is set to satisfy $x+y \leq 0.4$, a band structure is undesirably changed from a direct transition type to an indirect transition type. Note that this can be applied to an embodiment using a superlattice film.

It is also possible to use a substrate transparent to the emitted light, having a high melting point and substantially equal to BP in the lattice constant in the growing plane, such substrate including a TiO$_2$ substrate having a tetragonal crystal structure or a MnO substrate having a sodium chloride type crystal structure. In the case of using the TiO$_2$ or MnO substrate, the crystal growth can be carried out at high temperature so as to obtain a high quality crystal. Also, the lattice alignment can be improved so as to alleviate the stress applied to the active layer. Further, since the TiO$_2$ or MnO substrate is transparent to the emitted light, it is possible to avoid the light absorption in the substrate. These substrates are available on the market, permit a crystal growth on a large area and, thus, are suitable for use in the mass production of light emitting devices. It follows that the TiO$_2$ or MnO substrate is suitable for use in the manufacture of short wavelength light emitting elements having a long life and excellent in the function designing characteristics.

Although a GaN layer is used as a transparent contact layer in the above embodiments, a $Ga_vAl_{1-v}N$ ($0 \leq v \leq 1$) of a WZ type can be generally used. In addition, in order to achieve more excellent lattice matching between the $Ga_xAl_{1-x}N$ layer and the BP layer in the above embodiments, a small amount of, e.g., In may be mixed as a III group element besides B, Ga, and Al. Similarly, As or Sb can be mixed as a V group element. As source gases, e.g., triethylgallium (TEG), triethylaluminum (TEA), and trimethylboron (TMB) can be used as Ga, Al, and B sources, respectively. In addition, an organometallic compound called an "adduct" such as $Ga(C_2H_5)_3 \cdot NH_3$ or $Ga(CH_3)_3 \cdot N \cdot (CH_3)_3$ can be used as an N source besides hydrazine ($N_2H_4$).

The Mg materials used in the present invention include, for example, octamethyl dialuminum monomagnesium, magnesium, $Mg[Al(CH_3)_4]_2$, pentamethylaluminum magnesium, $MgAl(CH_3)_5$, isopropyl cyclopentadienyl magnesium, (i-$C_3H_8$)$_2$Cp$_2$Mg, dimethyl cyclopentadienyl magnesium, [CH$_3$)$_2$Cp]$_2$Mg, acetylacetone magnesium, (Chd 5H$_7$O$_2$)$_2$Mg, and dipivaloylmethyl magnesium, (C$_{11}$H$_{19}$O$_2$)$_2$Mg.

As has been described above, according to the present invention, an unprecedentedly high-luminance blue LED can be realized using a new five-element-based compound semiconductor material having a wide band gap and a ZB-type structure.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

What is claimed is:

1. A semiconductor light-emitting diode including a light-emitting layer with a p-n junction, said light-emitting layer comprising:

a first superlattice layer, of a first conductivity type, wherein a plurality of BP and $Ga_xAl_{1-x}N$ ($0 \leq x \leq 1$) layers are alternately stacked, said $Ga_xAl_{1-x}N$ ($0 \leq x \leq 1$) layers having a zinc blend type crystal structure; and a second superlattice layer, of a second conductivity type, wherein a plurality of BP and $Ga_xAl_{1-x}N$ ($0 \leq x \leq 1$) layers are alternately stacked, said $Ga_x$-

$Al_{l-x}N$ ($0 \leq x \leq 1$) layers having a zinc blend type crystal structure.

2. A semiconductor light-emitting diode including a light-emitting layer having a p-n junction, said light-emitting layer comprising:
   a first mixed crystal layer, consisting of a $Ga_xAl_yB_{l-x-y}N_zP_{l-z}$ ($0 \leq x, y, z \leq 1$ and $x+y \leq 1$) layer of a first conductivity type having a zinc blend type crystal structure; and
   a second mixed crystal layer, consisting of a $Ga_xAl_yB_{l-x-y}N_zP_{l-z}$ ($0 \leq x, y, z \leq 1$ and $x+y \leq 1$) layer of a second conductivity type having a zinc blend type crystal structure.

3. A semiconductor light-emitting diode including a light-emitting layer having a p-n junction, comprising:
   a substrate;
   a light-reflection layer formed on said substrate and having a plurality of $Ga_xAl_{l-x}N$ ($0 \leq x \leq 1$)/BP superlattice layers of two types having different average compositions;
   a first superlattice layer, formed on said light-reflection layer and being of a first conductivity type, wherein a plurality of BP and $Ga_xAl_{l-x}N$ ($0 \leq x \leq 1$) layers are alternately stacked, said $Ga_xAl_{l-x}N$ ($0 \leq x \leq 1$) layers having a zinc blend crystal structure; and
   a second superlattice layer, formed on said superlattice layer and being of a second conductivity type, wherein a plurality of BP and $Ga_xAl_{l-x}N$ ($0 \leq x \leq 1$) layers are alternately stacked, said $Ga_xAl_{l-x}N$ ($0 \leq x \leq 1$) layers having a zinc blend type crystal structure.

4. A diode according to claim 3, wherein said substrate is GaP or SiC.

5. A diode according to claim 3, wherein said substrate is of tetragonal crystal structure or of sodium chloride type crystal structure.

6. A diode according to claim 5, wherein the substrate of tetragonal crystal structure is $TiO_2$ and the substrate of sodium chloride type crystal structure is MnO.

7. A semiconductor light-emitting diode including a light-emitting layer having a p-n junction, comprising:
   a substrate;
   a light-reflection layer, formed on said substrate and having a plurality of $Ga_xAl_{l-x}N$ ($0 \leq x \leq 1$)/BP superlattice layers of two types having different average compositions;
   a first mixed crystal layer, formed on said light-reflection layer and consisting of a $Ga_xAl_yB_{l-x-y}N_zP_{l-z}$ ($0 \leq x, y, z \leq 1$ and $x+y \leq 1$) layer of a first conductivity type having a zinc blend type crystal structure; and
   a second mixed crystal layer, formed on said first mixed crystal layer and consisting of a $Ga_xAl_yB_{l-x-y}N_zP_{l-z}$ ($0 \leq x, y, z \leq 1$ and $x+y \leq 1$) layer of a second conductivity type having a zinc blend type crystal structure.

8. A diode according to claim 3 or 7, wherein said light-reflection layer has a multilayered structure in which said superlattice layers of the types are alternately stacked with a period which is substantially equal to the light-emitting wavelength.

9. A semiconductor light-emitting diode including a light-emitting layer having a p-n junction, comprising:
   a substrate;
   a light-reflection layer, formed on said substrate and having a plurality of $Ga_xAl_yB_{l-x-y}N_zP_{l-z}$ ($0 \leq x, y, z \leq 1$ and $x+y \leq 1$) mixed crystal layers of two types having different average compositions;
   a first superlattice layer, formed on said light-reflection layer and being of a first conductivity type, wherein a plurality of BP and $Ga_xAl_{l-x}N$ ($0 \leq x \leq 1$) layers are alternately stacked, said $Ga_xAl_{l-x}N$ ($0 \leq x \leq 1$) layers having a zinc blend crystal structure; and
   a second superlattice layer, formed on said first superlattice layer and being of a second conductivity type, wherein a plurality of BP and $Ga_xAl_{l-x}N$ ($0 \leq x \leq 1$) layers are alternately stacked, said $Ga_xAl_{l-x}N$ ($0 \leq x \leq 1$) layers having a zinc blend type crystal structure.

10. A semiconductor light-emitting diode including a light-emitting layer having a p-n junction, comprising:
    a substrate;
    a light-reflection layer, formed on said substrate and having a plurality of $Ga_xAl_yB_{l-x-y}N_zP_{l-z}$ ($0 \leq x, y, z \leq 1$ and $x+y \leq 1$) mixed crystal layers of two types having different average compositions;
    a first mixed crystal layer, formed on said light-reflection layer and consisting of a $Ga_xAl_yB_{l-x-y}N_zP_{l-z}$ ($0 \leq x, y, z \leq 1$ and $x+y \leq 1$) layer of a first conductivity type having a zinc blend type crystal structure; and
    a second mixed crystal layer, formed on said first mixed crystal layer and consisting of a $Ga_xAl_yB_{l-x-y}N_zP_{l-z}$ ($0 \leq x, y, z \leq 1$ and $x+y \leq 1$) layer of a second conductivity type having a zinc blend type crystal structure.

11. A diode according to claim 9 or 10, wherein said light-reflection layer has a multilayered structure in which said mixed crystal layers of two types are alternately stacked with a periodicity which is substantially equal to the light-emitting wavelength.

12. A semiconductor light-emitting diode including a light-emitting layer having a p-n junction, comprising:
    a substrate;
    a first superlattice layer, formed on said substrate and being of a first conductivity type, wherein a plurality of BP and $Ga_xAl_{l-x}N$ ($0 \leq x \leq 1$) layers are alternately stacked directly or via a buffer layer, said $Ga_xAl_{l-x}N$ ($0 \leq x \leq 1$) layers having a zinc blend type crystal structure;
    a second superlattice layer, formed on said first superlattice layer and being of a second conductivity type, wherein a plurality of BP and $Ga_xAl_{l-x}N$ ($0 \leq x \leq 1$) layers are alternately stacked, said $Ga_xAl_{l-x}N$ ($0 \leq x \leq 1$) layers having a zinc blend type crystal structure;
    a contact layer consisting of a $Ga_vAl_{l-v}N$ ($0 \leq v \leq 1$) layer of a Wurzite type and formed on said second superlattice layer; and
    an electrode formed on said contact layer.

13. A semiconductor light-emitting diode including a light-emitting layer having a p-n junction, comprising:
    a substrate;
    a first mixed crystal layer, consisting of a $Ga_xAl_yB_{l-x-y}N_zP_{l-z}$ ($0 \leq x, y, z \leq 1$ and $x+y \leq 1$) layer of a first conductivity type, having a zinc blend type crystal structure and formed on said substrate directly or via a buffer layer;
    a second mixed crystal layer, consisting of a $Ga_xAl_yB_{l-x-y}N_zP_{l-z}$ ($0 \leq x, y, z \leq 1$ and $x+y \leq 1$) layer of a second conductivity type, having a zinc blend type crystal structure and formed on said first mixed crystal layer;
    a contact layer consisting of a $Ga_vAl_{l-v}N$ ($0 \leq v \leq 1$) layer of a Wurzite type and formed on said second mixed crystal layer; and
    an electrode formed on said contact layer.

* * * * *